(12) United States Patent
Kishida et al.

(10) Patent No.: US 7,804,368 B2
(45) Date of Patent: *Sep. 28, 2010

(54) OSCILLATOR AND CHARGE PUMP CIRCUIT USING THE SAME

(75) Inventors: Masanobu Kishida, Hyogo (JP); Fukashi Morishita, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 152 days.

This patent is subject to a terminal disclaimer.

(21) Appl. No.: 12/155,876

(22) Filed: Jun. 11, 2008

(65) Prior Publication Data

US 2008/0252388 A1      Oct. 16, 2008

Related U.S. Application Data

(63) Continuation of application No. 11/311,301, filed on Dec. 20, 2005, now Pat. No. 7,397,315.

(30) Foreign Application Priority Data

Dec. 20, 2004    (JP) ............................. 2004-367060
Sep. 29, 2005    (JP) ............................. 2005-283844

(51) Int. Cl.
    *H03B 27/00*    (2006.01)
(52) U.S. Cl. ................... 331/16; 331/57; 331/74; 331/185; 331/34; 327/536
(58) Field of Classification Search .................. 331/57, 331/16, 34, 185, 74; 327/536
    See application file for complete search history.

(56) References Cited

U.S. PATENT DOCUMENTS 5,457,429 A    10/1995    Ogawa et al.
(Continued)

FOREIGN PATENT DOCUMENTS

JP            04-152711              5/1992
(Continued)

OTHER PUBLICATIONS

Japanese Office Action, with partial English translation, issued in Japanese Patent Application No. 2005-283844, mailed Jul. 20, 2010.
(Continued)

*Primary Examiner*—Arnold Kinkead
(74) *Attorney, Agent, or Firm*—McDermott Will & Emery LLP

(57) ABSTRACT

The present invention provides a current-limited oscillator capable of performing stable operation even when it is driven with a low power-supply voltage, and a charge pump circuit using the oscillator. A current-limited oscillator has a delay section that includes a plurality of series-connected inverters to delay an output pulse on the basis of a current limiting level indication signal, and the oscillator further includes at least one first transistor that limits a first current between the inverters and a high potential power supply and at least one second transistor that limits a second current between the inverters and a low potential power supply, wherein at least one of the plurality of inverters is configured as a first inverter that is connected with the first transistor and is not connected with the second transistor, and at least another of the plurality of inverters is configured as a second inverter that is not connected with the first transistor and is connected with the second transistor.

4 Claims, 24 Drawing Sheets

U.S. PATENT DOCUMENTS

| | | |
|---|---|---|
| 5,703,541 A | 12/1997 | Nakashima |
| 5,912,591 A | 6/1999 | Yamada |
| 6,137,345 A | 10/2000 | Kaneko et al. |
| 6,759,875 B2 | 7/2004 | Mano et al. |
| 7,042,266 B2 | 5/2006 | Takahashi |
| 7,122,868 B2 | 10/2006 | Honda |

FOREIGN PATENT DOCUMENTS

| | | |
|---|---|---|
| JP | 06-021776 | 1/1994 |
| JP | 07-066693 | 3/1995 |
| JP | 08-330912 | 12/1996 |
| JP | 09-214306 | 8/1997 |
| JP | 10-229166 | 8/1998 |
| JP | 2002-124858 | 4/2002 |
| JP | 2002-198784 | 7/2002 |
| JP | 2002-353781 | 12/2002 |
| JP | 2003-283304 | 10/2003 |
| JP | 2003-339156 | 11/2003 |
| JP | 2004-253880 | 9/2004 |

OTHER PUBLICATIONS

Dally, W. J., et al., "Digital Systems Engineering, Basic Edition", Mar. 30, 2003.

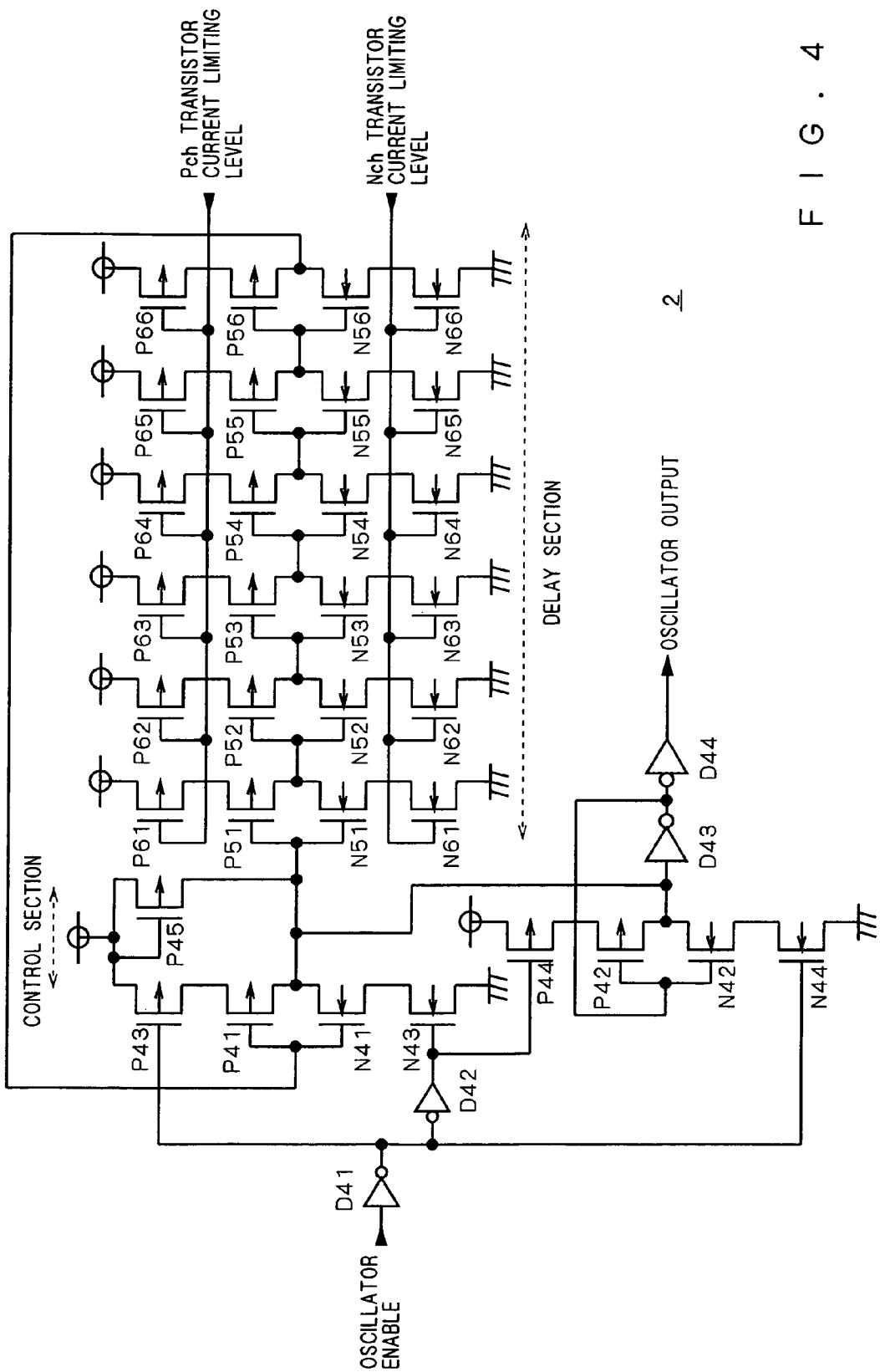
F I G . 4

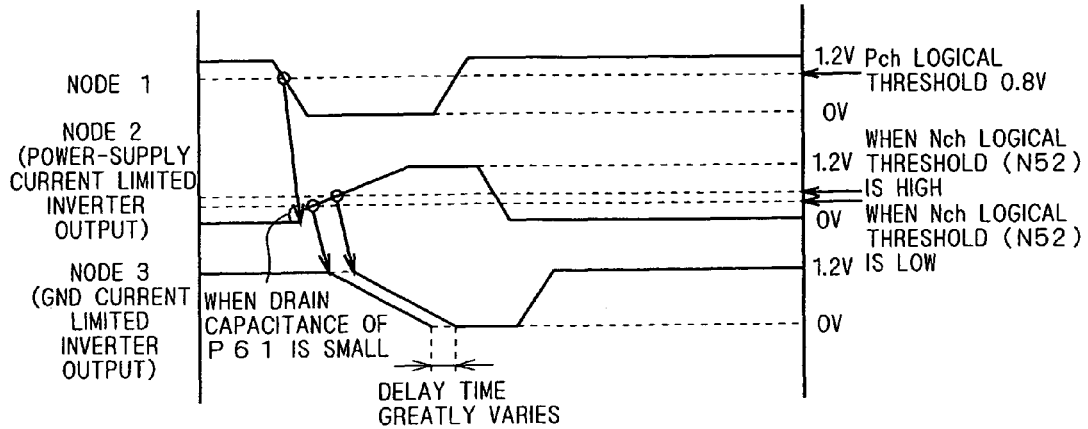
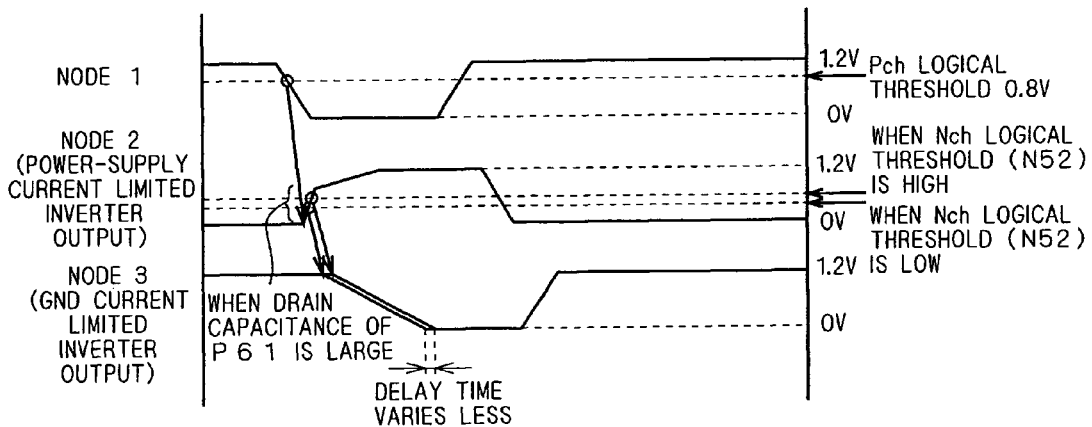

OSCILLATOR AND CHARGE PUMP CIRCUIT USING THE SAME

RELATED APPLICATIONS

This application is a Continuation of U.S. application Ser. No. 11/311,301, filed Dec. 20, 2005, now U.S. Pat. No. 7,397,315, claiming priority of Japanese Application Nos. 2004-367060, filed Dec. 20, 2004, and 2005-283844, filed Sep. 29, 2005, the entire contents of each of which are hereby incorporated by reference.

BACKGROUND OF THE INVENTION

1. Field of the Invention

The present invention relates to an oscillator and a charge pump circuit using the same, and particularly to a current-limited oscillator and a charge pump circuit using the same.

2. Description of the Background Art

Recently, semiconductor circuits with lower power-supply voltages are produced with the advance of process miniaturization techniques. Specifically, power-supply voltages in common logic circuits are around 1.0 V to 1.2 V. However, the thresholds (Vth) of transistors are not remarkably improved despite the reduced power-supply voltages and are still around 0.5 V to 0.7. That is, at present, power-supply voltages are about twice (2Vth) the transistor thresholds (Vth).

Also, storage-type memories, such as DRAMs (Dynamic Random Access Memories), require VPP voltage higher than the power-supply voltage and VBB voltage lower than the GND voltage. Accordingly, semiconductor circuits are provided with charge pump circuits for boosting the power-supply voltage and GND voltage, and the charge pump circuits are provided with oscillators of current-limited type. Conventional oscillators are disclosed in Japanese Patent Application Laid-Open Nos. 7-66693 (1995) and 8-330912 (1996), for example.

When a current-limited oscillator is driven with a relatively high power-supply voltage, the period of the delayed output is not considerably varied by process finish variations and temperature variations and the oscillator offers stable operation. However, when the current-limited oscillator is driven with a low power-supply voltage, the operation tends to be unsteady with the period of the output pulse significantly varied by process finish variations and temperature variations.

SUMMARY OF THE INVENTION

An object of the present invention is to provide a current-limited oscillator capable of performing stable operation even when driven with a low power-supply voltage and a charge pump circuit using the oscillator.

According to the present invention, a current-limited oscillator includes a delay section that includes a plurality of series-connected inverters to delay an output pulse on the basis of a current limiting level indication signal, and further includes at least one first transistor and at least one second transistor. The first transistor limits a first current between the inverters and a high potential power supply. The second transistor limits a second current between the inverters and a low potential power supply. At least one of the plurality of inverters is configured as a first inverter that is connected with the first transistor and is not connected with the second transistor, and at least another of the plurality of inverters is configured as a second inverter that is not connected with the first transistor and is connected with the second transistor.

Thus, according to the oscillator of the present invention, at least one of the plurality of inverters is configured as a first inverter that is connected with the first transistor and is not connected with the second transistor, and at least another of the plurality of inverters is configured as a second inverter that is not connected with the first transistor and is connected with the second transistor, so that the oscillator is capable of performing stable operation even when driven with a low power-supply voltage.

According to the present invention, a charge pump circuit includes a constant-current generating circuit, an oscillator, and a voltage generating circuit. The constant-current generating circuit outputs a current limiting level indication signal. The oscillator includes a delay section that includes a plurality of series-connected inverters to delay an output pulse on the basis of the current limiting level indication signal, and further includes at least one first transistor that limits a first current between the inverters and a high potential power supply and at least one second transistor that limits a second current between the inverters and a low potential power supply, wherein at least one of the plurality of inverters is configured as a first inverter that is connected with the first transistor and is not connected with the second transistor, and at least another of the plurality of inverters is configured as a second inverter that is not connected with the first transistor and is connected with the second transistor. The voltage generating circuit generates an output potential based on an output of the oscillator.

According to the present invention, the charge pump circuit has an oscillator in which at least one of the plurality of inverters is configured as a first inverter that is connected with the first transistor and is not connected with the second transistor, and at least another of the plurality of inverters is configured as a second inverter that is not connected with the first transistor and is connected with the second transistor, so that the charge pump circuit is capable of performing stable operation even when driven with a low power-supply voltage.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 4 to 6 are circuit diagrams of current-limited oscillators giving a background of the present invention;

FIGS. 19 to 22 are waveform diagrams used to describe variations of the delay time of the current-limited oscillator according to the eighth preferred embodiment of the present invention;

DESCRIPTION OF THE PREFERRED EMBODIMENTS

First Preferred Embodiment

Figure 1:
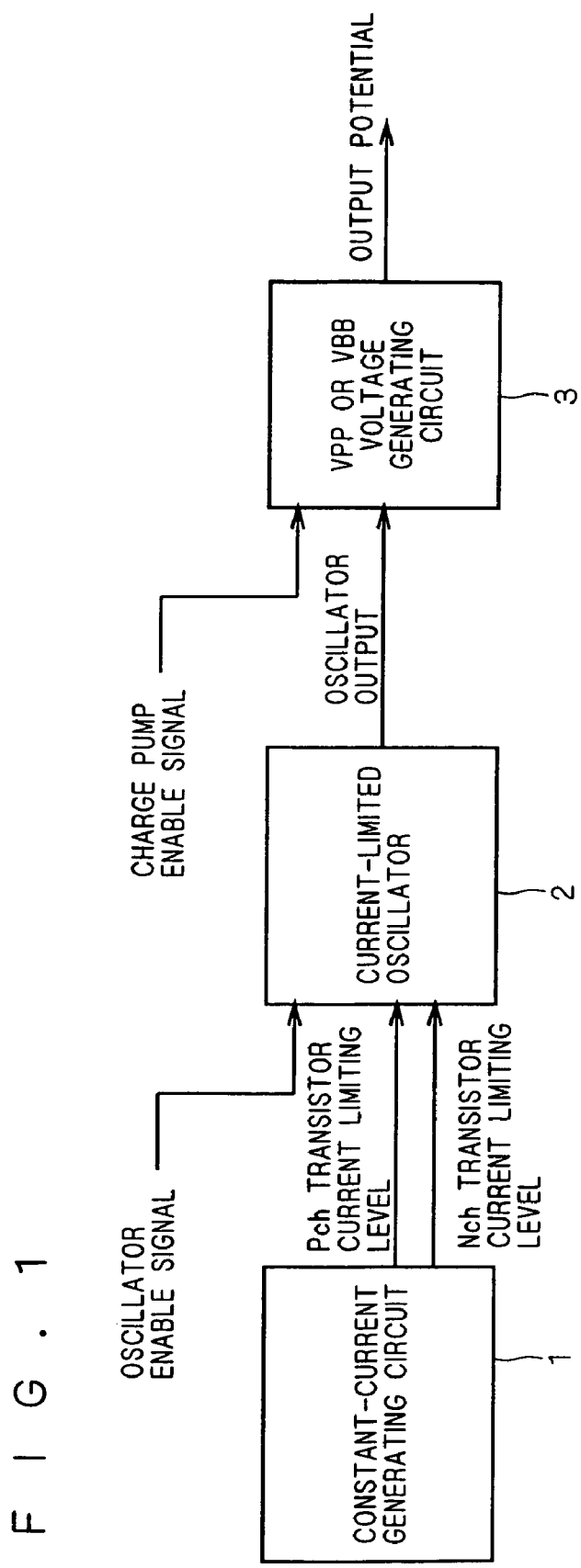
FIG. 1 is a block diagram of a charge pump circuit according to a first preferred embodiment of the present invention.
Figure 2:
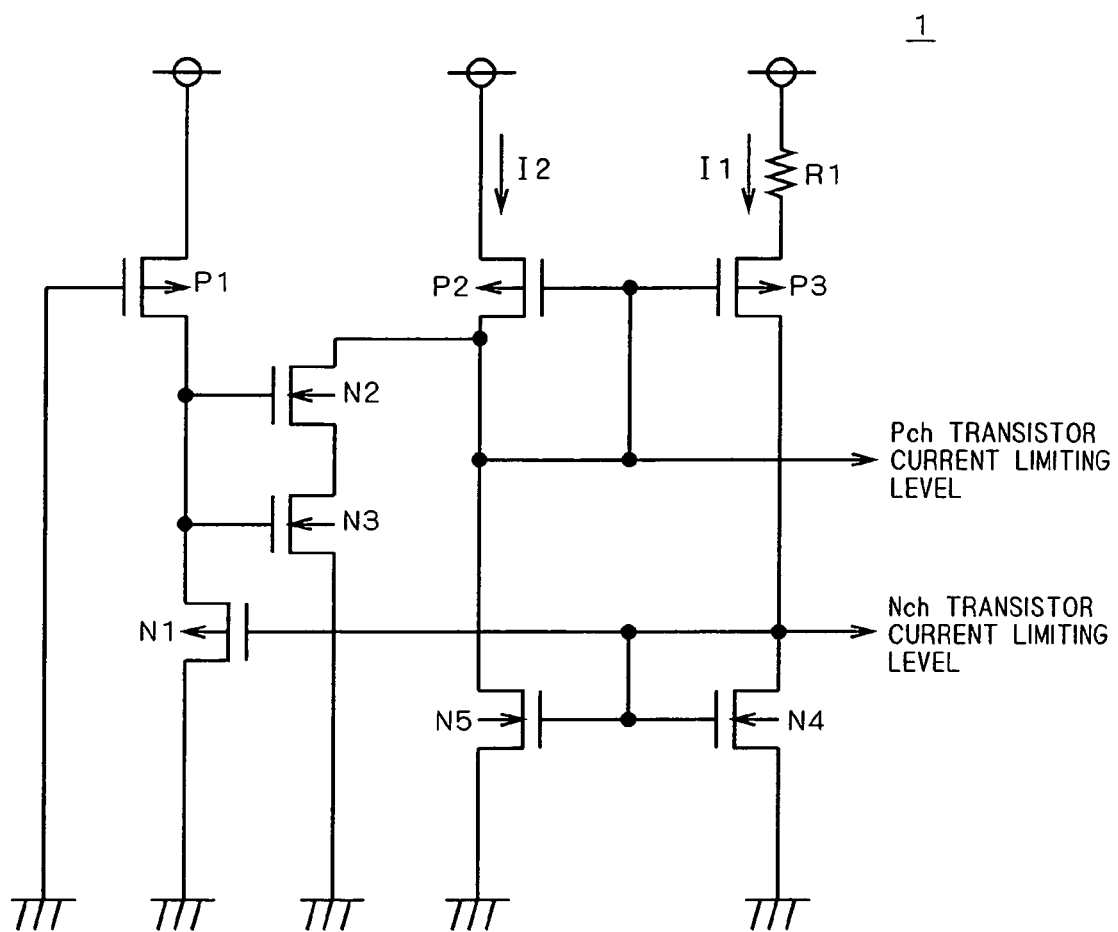
FIG. 2 is a circuit diagram of a constant-current generating circuit according to the first preferred embodiment of the present invention.

FIG. 1 is a block diagram of a charge pump circuit according to a first preferred embodiment. The charge pump circuit shown in FIG. 1 includes a constant-current generating circuit 1, a current-limited oscillator 2, and a VPP or VBB voltage generating circuit 3. FIG. 2 is a circuit diagram of the constant-current generating circuit 1. The constant-current generating circuit 1 of FIG. 2 includes P-channel (hereinafter "Pch") transistors P1, P2, P3, N-channel (hereinafter "Nch") transistors N1, N2, N3, N4, N5, and a resistor element R1. The current I1 supplied to the source of the Pch transistor P3 is chiefly limited by the resistor element R1.

The Pch transistors P2 and P3 and the Nch transistors N4 and N5 form a current mirror circuit, and therefore a Pch transistor current limiting level indication signal (hereinafter referred to simply as a Pch transistor current limiting level) and an Nch transistor current limiting level indication signal (hereinafter referred to simply as an Nch transistor current limiting level) are generated so that the current I2 flowing through the Pch transistor P2 and the Nch transistor N5 exhibits the same value as the current I1.

Figure 3:
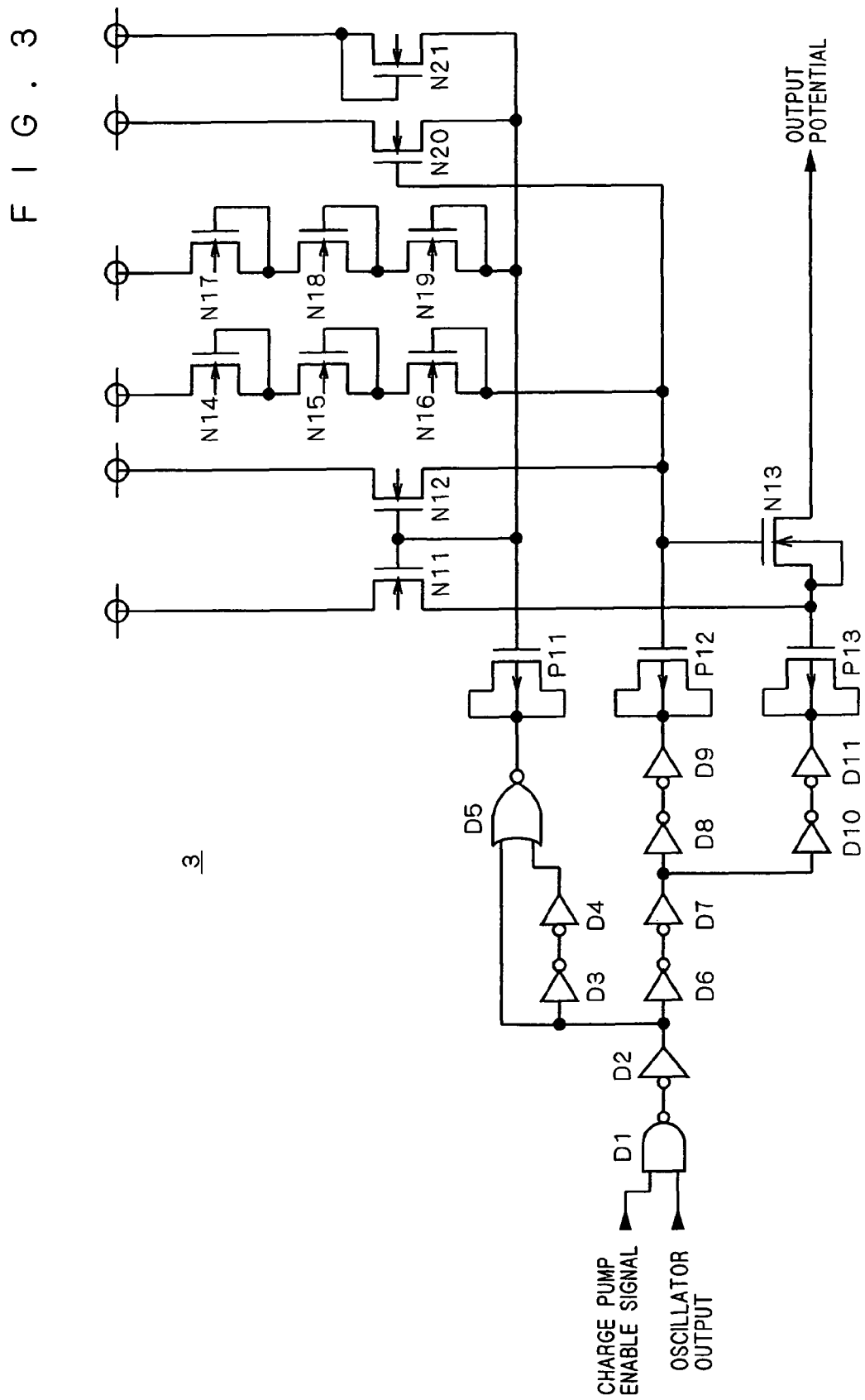
FIG. 3 is a circuit diagram of a VPP voltage generating circuit according to the first preferred embodiment of the present invention.

Next, FIG. 3 is a circuit diagram of the voltage generating circuit 3 of this preferred embodiment. The voltage generating circuit 3 of FIG. 3 is a circuit that generates VPP voltage, and it includes a NAND gate D1 and an inverter D2, where the NAND gate D1 receives a charge pump enable signal and an oscillator output from the current-limited oscillator 2. In the voltage generating circuit 3 of FIG. 3, the output of the inverter D2, and the output of the inverter D2 passing through an inverter D3 and an inverter D4, are inputted to a NOR gate D5, and the output of the NOR gate D5 is inputted to the source/drain of a Pch transistor P11. The output of the inverter D2 is also inputted to the source/drain of a Pch transistor P12 through inverters D6 to D9, and also to the source/drain of a Pch transistor P13 through the inverters D6, D7, D10 and D11.

In the voltage generating circuit 3 of FIG. 3, the gate of the Pch transistor P11 is connected to the gates of Nch transistors N11 and N12, and the gate of the Pch transistor P12 is connected to the gate of an Nch transistor N13. The source of the Nch transistor N13 is connected to the gate of the Pch transistor P13 and the drain of the Nch transistor N13 outputs the output potential. The voltage generating circuit 3 of FIG. 3 further includes Nch transistors N14, N15, N16 connected between the power supply as a high potential power supply and the gate of the Pch transistor P12, Nch transistors N17, N18, N19 between the power supply and the gate of the Pch transistor P11, and an Nch transistor N20 and an Nch transistor N21 between the power supply and the gate of the Pch transistor P11.

FIG. 4 is a circuit diagram of a current-limited oscillator 2 giving a background of the present invention. The current-limited oscillator 2 of FIG. 4 includes a control section and a delay section. The control section includes an inverter formed of a Pch transistor P41 and an Nch transistor N41, and an inverter formed of a Pch transistor P42 and an Nch transistor N42. The control section also includes a Pch transistor P43 between the power supply and the Pch transistor P41, a Pch transistor P44 between the power supply and the Pch transistor P42, an Nch transistor N43 between GND as a low potential power supply and the Nch transistor N41, and an Nch transistor N44 between the GND and the Nch transistor N42. The control section further includes a Pch transistor P45 between the power supply and the drain of the Pch transistor P41.

The delay section includes six stages of inverters. The first-stage inverter, connected with the drain of the Pch transistor P42, is formed of a Pch transistor P51 arid an Nch transistor N51, with a power-supply current limiting transistor P61 between the Pch transistor P51 and the power supply, and with a GND current limiting transistor N61 between the Nch transistor N51 and the GND. Similarly, the second-stage and following inverters are respectively formed of Pch transistors P52 to P56 and Nch transistors N52 to N56, respectively with power-supply current limiting transistors P62 to P66 between the Pch transistors P52 to P56 and the power supply, and respectively with GND current limiting transistors N62 to N66 between the Nch transistors N52 to N56 and the GND.

An oscillator enable signal, as a control signal input to the current-limited oscillator 2, is given to the gates of the Pch transistor P43 and the Nch transistor N44 through an inverter D41, and also to the Nch transistor N43 and the Pch transistor P44 through the inverters D41 and D42.

The outputs from the drains of the Pch transistors P41 and P42 form the oscillator output through inverters D43 and D44. The Pch transistor current limiting level generated in the constant-current generating circuit 1 is supplied to the gates of the power-supply current limiting transistors P61 to P66, and the Nch transistor current limiting level is supplied to the gates of the GND current limiting transistors N61 to N66. When the power-supply current limiting transistors P61 to P66 and the GND current limiting transistors N61 to N66 have the same transistor size as the Pch transistor P2 and the Nch transistor N5 in the constant-current generating circuit 1, then the peaks of the operating currents of the power-supply current limiting transistors P61 to P66 and the GND current limiting transistors N61 to N66 are limited to value close to the current I1.

Next, the operation of the delay section of the current-limited oscillator 2 of FIG. 4 will be described. The first-stage inverter (the Pch transistor P51 and the Nch transistor N51), for example, is current-limited both on the power supply side and the GND side by the power-supply current limiting transistor P61 and the GND current limiting transistor N61. Accordingly, the output of the first-stage inverter is delayed both at transitions from "1" to "0" and transitions from "0" to "1". Also, because the power-supply current limiting transistor P62 is in an ON state in a transient region, the source potential of the Pch transistor P52 in the second-stage inverter is voltage-dropped by about ½Vth from the power-supply voltage VDD. The logical threshold of the Pch transistor P52 is also lowered accordingly.

Also, because the GND current limiting transistor N62 is in an ON state in a transient region, the source potential of the Nch transistor N52 in the second-stage inverter is voltage-increased by about ½Vth from the power-supply voltage VDD. The logical threshold of the Nch transistor N52 is also heightened accordingly. The voltage variations of the source currents of the Pch transistor P52 and the Nch transistor N52 vary in the range of, e.g., ⅓Vth to ⅔Vth, depending on the frequency required for the current-limited oscillator 2 and consumed power.

Next, when the output of the first-stage inverter varies from "0" to "1" and the output of the second-stage inverter varies from "1" to "0", and the power supply of the first-stage inverter is current-limited by the power-supply current limiting transistor P61 and the GND of the second-stage inverter is current-limited by the GND current limiting transistor N62, then the "0" to "1" transition of the output of the first-stage inverter is delayed by the power-supply current limiting. Also, the source potential of the Nch transistor N52 in the second stage is increased by about ½Vth and the logical threshold is also increased by about ½Vth, and therefore the input "1" of the second-stage inverter takes a longer time to reach the logical threshold.

Figure 5:
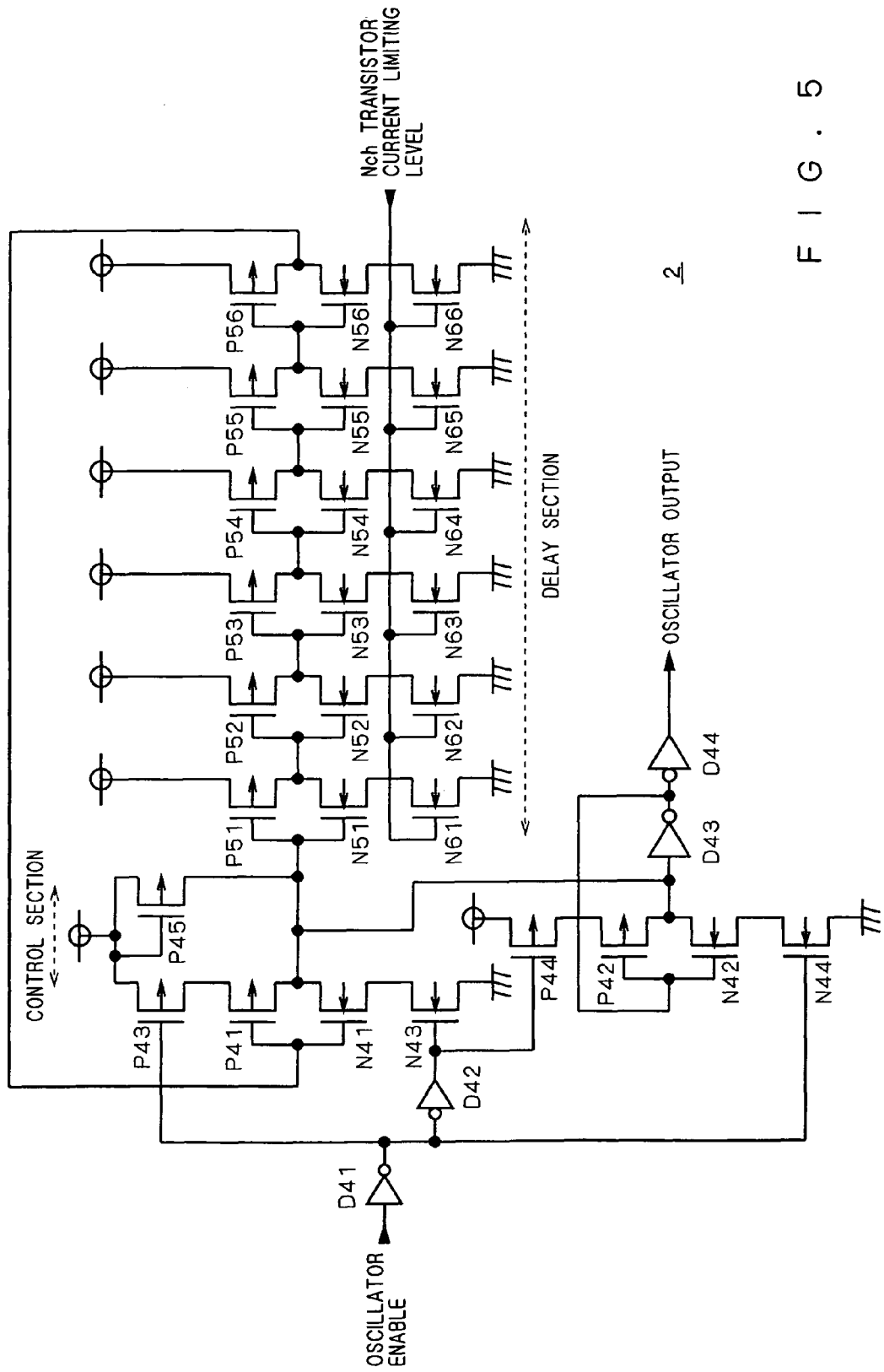
Figure 6:
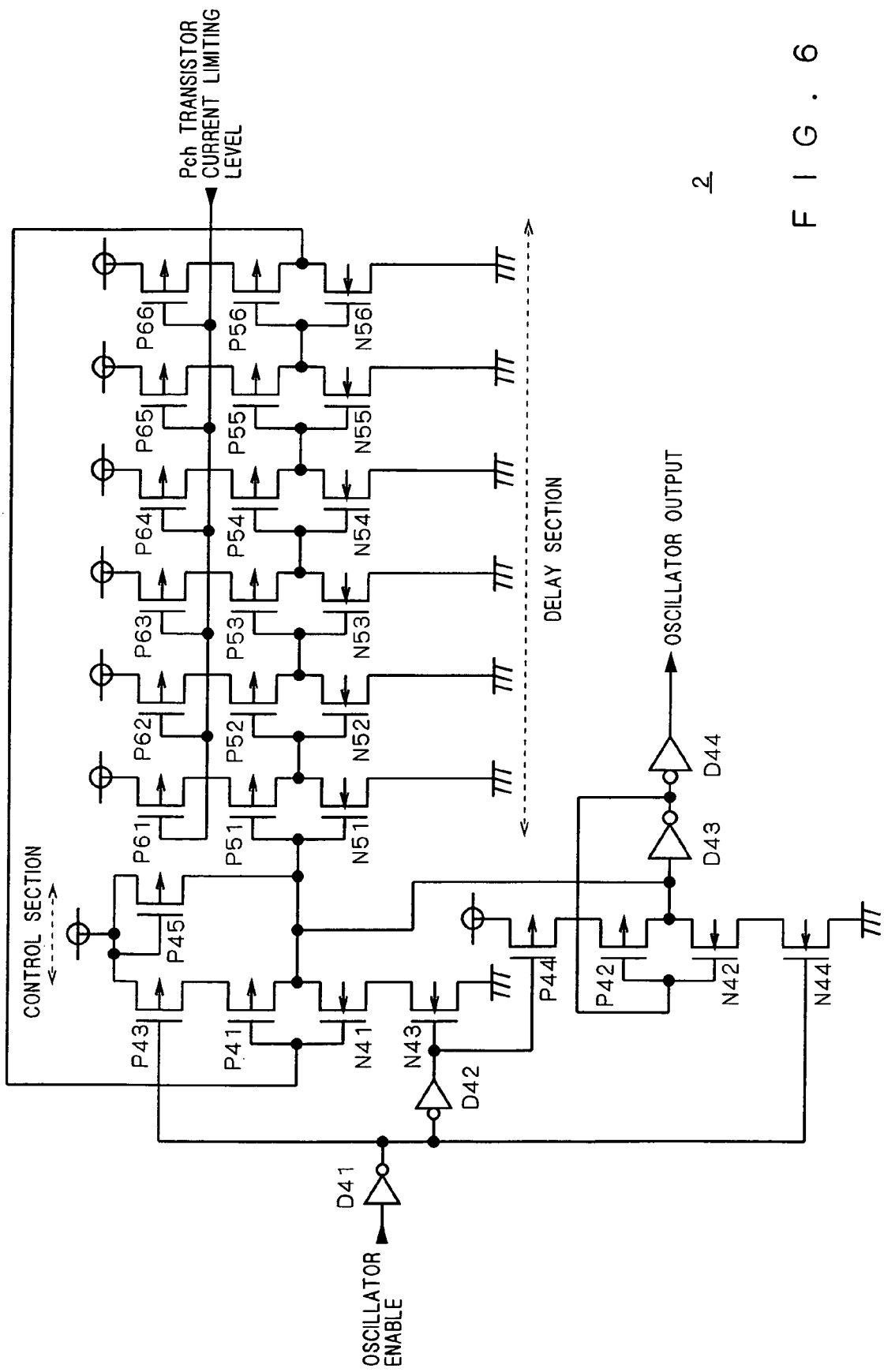

Next, FIGS. 5 and 6 show current-limited oscillators 2 which also provide a background of the present invention, like the current-limited oscillator 2 of FIG. 4. The current-limited oscillator 2 of FIG. 5 is an example that includes only the GND current limiting transistors N61 to N66 provided for the inverters in the delay section. The current-limited oscillator 2 of FIG. 6 is an example that includes only the power-supply current limiting transistors P61 to P66 provided for the inverters in the delay section.

The current-limited oscillators 2 shown in FIGS. 4 to 6 have the following disadvantages or problems. In the current-limited oscillator 2 of FIG. 4, the power-supply current limiting transistors P61 to P66 and the GND current limiting transistors N61 to N66 provided for the inverters in the delay section operate in transient regions, and so the inverters in the delay section are driven by voltage lower than the power-supply voltage. In the example above, when the power-supply voltage VDD is 2Vth and the voltage variations of the power-supply current limiting transistors P61 to P66 and the GND current limiting transistors N61 to N66 are about ½Vth, then the inverters in the delay section operate at about 1Vth and may fail to perform steady operation.

Also, in the current-limited oscillator 2 of FIG. 5, the first-stage inverter, for example, is provided only with the GND current limiting transistor N61, and output transitions from "1" to "0" are delayed. However, unlike in the current-limited oscillator 2 shown in FIG. 4, the source potential of the Pch transistor P52 in the second-stage inverter is not voltage-dropped by about ½Vth from the power-supply voltage VDD, and therefore the logical threshold of the Pch transistor P52 is not lowered. Accordingly, an input "0" to the second-stage inverter of FIG. 5 takes a shorter time to reach the logical threshold than that of FIG. 4. That is, the current-limited oscillator 2 shown in FIG. 5 offers a smaller delay effect than the current-limited oscillator 2 shown in FIG. 4. Especially, with lower power-supply voltage, the amplitude in the delay section is smaller and the delay effect is still smaller. However, the current-limited oscillator 2 shown in FIG. 5 is capable of performing more steady operation than the current-limited oscillator 2 of FIG. 4 because the voltage variations are caused only by the GND current limiting transistors N61 to N66.

Also, in the current-limited oscillator 2 of FIG. 6, the first-stage inverter, for example, is provided only with the power-supply current limiting transistor P61, and output transitions from "0" to "1" are delayed. However, unlike in the current-limited oscillator 2 shown in FIG. 4, the source potential of the Nch transistor N52 in the second-stage inverter is not heightened by about ½Vth from the GND, and therefore the logical threshold of the Nch transistor N52 is not heightened. Accordingly, an input "1" to the second-stage inverter of FIG. 6 takes a shorter time to reach the logical threshold than that of FIG. 4. That is, the current-limited oscillator 2 shown in FIG. 6 offers a smaller delay effect than the current-limited oscillator 2 shown in FIG. 4. Especially, with lower power-supply voltage, the amplitude in the delay section is smaller and the delay effect is still smaller. However, the current-limited oscillator 2 shown in FIG. 6 is capable of performing more steady operation than the current-limited oscillator 2 of FIG. 4 because the voltage variations are caused only by the power-supply current limiting transistors P61 to P66.

Figure 7:
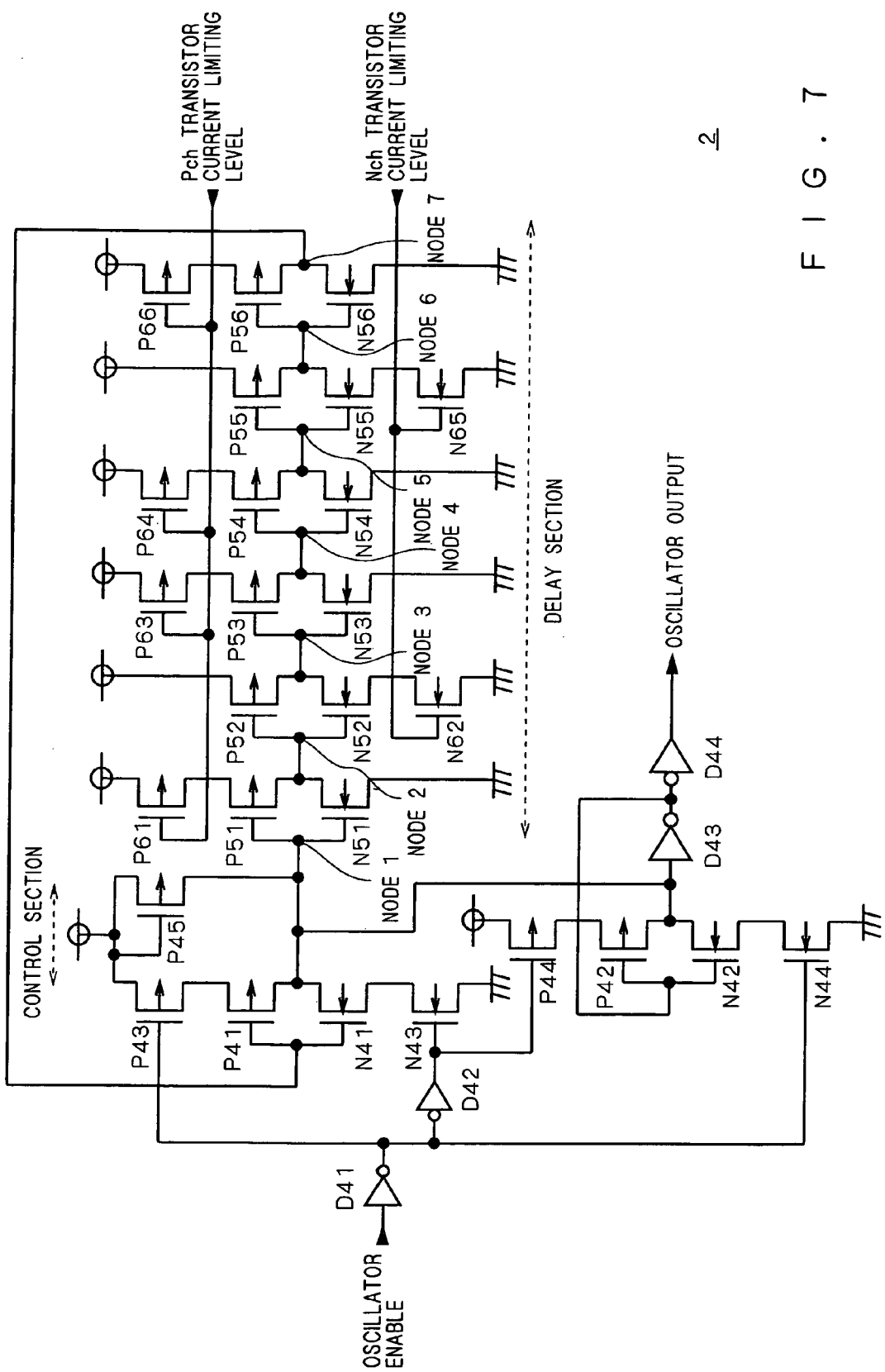
FIG. 7 is a circuit diagram of a current-limited oscillator according to the first preferred embodiment of the present invention.

Accordingly, to solve the problems above, a current-limited oscillator 2 according to this preferred embodiment is shown in FIG. 7. The current-limited oscillator 2 of FIG. 7 differs from the current-limited oscillator 2 of FIG. 4 only in the configuration of the delay section. Accordingly, only the different configuration will be described and the remaining parts are not described here again. The current-limited oscillator 2 of this preferred embodiment has a function of stopping operation with the oscillator enable signal as a control signal and holding the oscillator output immediately before the stop.

In the current-limited oscillator 2 of this preferred embodiment, too, the delay section includes six stages of inverters. The first-stage inverter (a Pch transistor P51 and an Nch transistor N51) is provided only with a power-supply current limiting transistor P61, the second-stage inverter (a Pch transistor P52 and an Nch transistor N52) is provided only with a GND current limiting transistor N62, and the third-stage inverter (a Pch transistor P53 and an Nch transistor N53) is provided only with a power-supply current limiting transistor P63. The first-stage to third-stage inverters form a block that delays the rising portions of the oscillator output pulse.

Also, the fourth-stage inverter (a Pch transistor P54 and an Nch transistor N54) is provided only with a power-supply current limiting transistor P64, the fifth-stage inverter (a Pch transistor P55 and an Nch transistor N55) is provided only with a GND current limiting transistor N65, and the sixth-stage inverter (a Pch transistor P56 and an Nch transistor N56) is provided only with a power-supply current limiting transistor P66. The fourth-stage to sixth-stage inverters form a block that delays the falling portions of the oscillator output pulse.

In the current-limited oscillator 2 of this preferred embodiment, the delay section is configured as shown in FIG. 7 so that the third-stage inverter provided only with the power-supply current limiting transistor P63 is contiguous to the fourth-stage inverter provided only with the power-supply current limiting transistor P64. Now, a "1" to "0" output of the third-stage inverter rapidly varies because the GND current is not limited. Then, the charge stored in the drain of the power-supply current limiting transistor P64 while the Pch transistor P54 of the fourth-stage inverter is in an OFF state is rapidly discharged when the Pch transistor P54 rapidly turns on. Therefore, the relation between the third stage and the fourth stage is capable of reducing the oscillator output delay effect.

This relation can be utilized to prevent the problem that the period of the oscillator output varies when the oscillator output is delayed by an increase in the transistor logical threshold caused by process finish variations and temperature variations. The variations of the period of the oscillator output can be minimized by adjusting the drain capacitance of the power-supply current limiting transistor P64 by adjusting the size of the power-supply current limiting transistor P64. The relation between the third stage and the fourth stage can be similarly applied to the relation between the zeroth stage and the first stage.

The relation between the third stage and the fourth stage is generalized as provision of a power-supply current limiting transistor for an inverter that follows an inverter whose GND current is not limited and that is supplied with "0" as a low potential. Applying this relation to the delay section reduces the variations of the period of the oscillator output that are caused by process finish variations and temperature variations.

Figure 8:
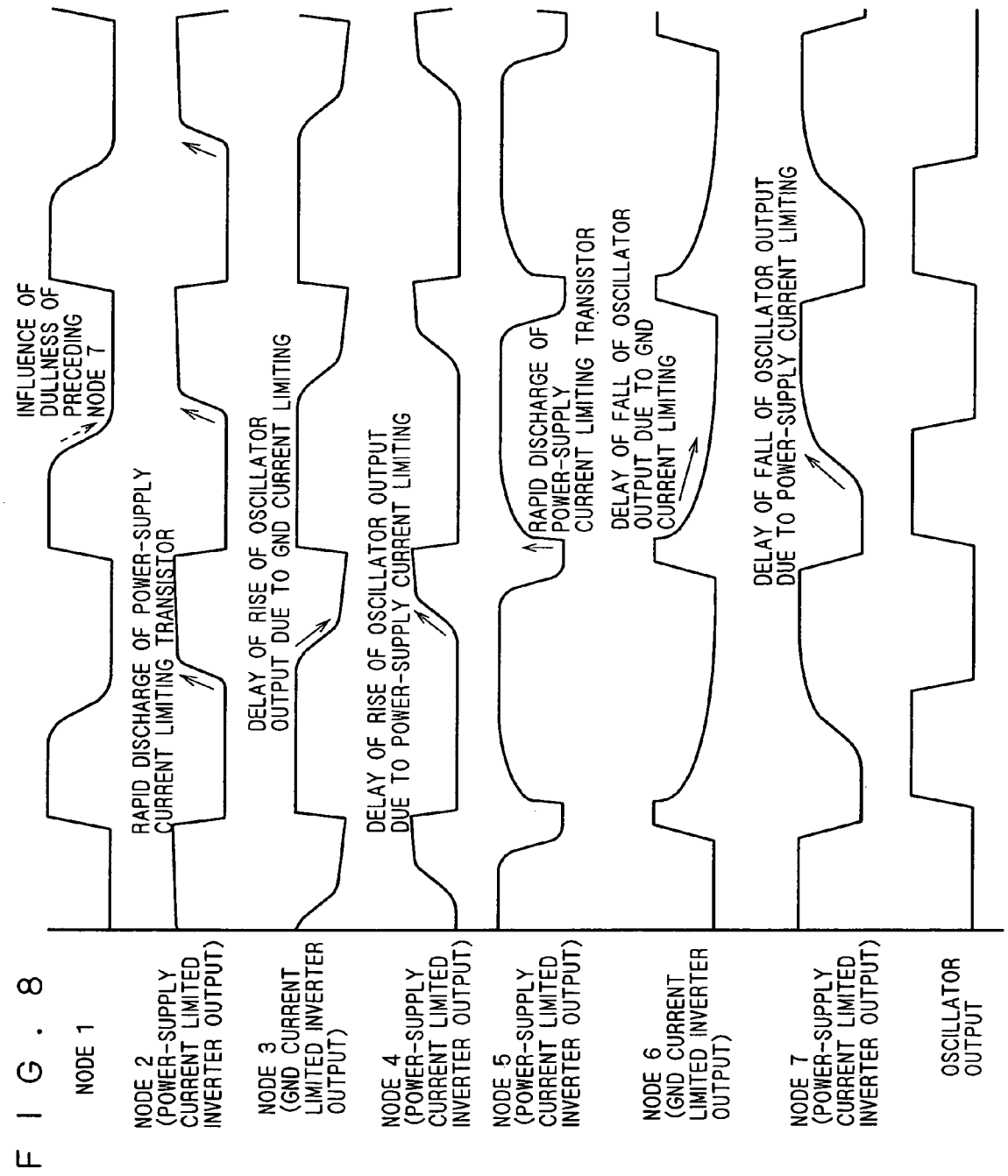
FIG. 8 is a waveform diagram of the current-limited oscillator according to the first preferred embodiment of the present invention.

Next, FIG. 8 shows the waveforms of the outputs of the inverters in the delay section and the waveform of the oscillator output of the current-limited oscillator 2 of this preferred embodiment. The nodes 1 to 6 show the inputs of the respective inverters and the node 7 shows the output of the sixth-stage inverter. The waveform of the node 1 is inputted to the first-stage inverter and outputted as the waveform of the node 2. The inverter in the control stage (the Pch transistor P41 and Nch transistor N41) and the first-stage inverter have a relation similar to that between the third-stage and fourth-stage inverters, and therefore the charge stored in the current limiting transistor P61 is rapidly discharged to form the waveform of node 2, though it is somewhat affected by the dullness of the node 7 that precedes the node 1. The waveform at the node 2 is inputted to the second-stage inverter and the waveform at the node 3 is delayed in its falling portion (the portion corresponding to the rising portion of the node 2).

Next, the waveform of the node 3 is inputted to the third-stage inverter and outputted as the waveform of the node 4. Because the third-stage inverter has the power-supply current limiting transistor P63, the waveform at the node 4 is delayed in the rising portion (the portion corresponding to the rising portion of the node 2). The waveform at the node 4 is inputted to the fourth-stage inverter and outputted as the waveform of the node 5. Because the third stage and the fourth stage have the relation described above, the charge stored in the power-supply current limiting transistor P64 is rapidly discharged to form the waveform of the node 5. The waveform at the node 5 is inputted to the fifth-stage inverter and outputted as the waveform of the node 6. Because the fifth-stage inverter has the GND current limiting transistor N65, the waveform at the node 6 is delayed in the falling portion. The waveform of the node 6 is inputted to the sixth-stage inverter and outputted as the waveform of the node 7. Because the sixth-stage inverter has the power-supply current limiting transistor P66, the waveform at the node 7 is delayed in the rising portion (the portion corresponding to the falling portion of the node 6).

Thus, in the current-limited oscillator 2 of this preferred embodiment, the delay section is configured as shown in FIG. 7 so that inverters provided with a transistor that limits only the power-supply current and inverters provided with a transistor that limits only the GND current are successively arranged, and it is possible to enhance the delay effect by varying the logical thresholds as in the current-limited oscillator 2 shown in FIG. 4. Accordingly, the current-limited oscillator 2 of this preferred embodiment allows reduction of the number of inverter stages in the delay section, as compared with the current-limited oscillators 2 shown in FIGS. 5 and 6.

Furthermore, as shown in FIG. 7, each inverter in the delay section is provided only with a power-supply current limiting transistor or with a GND current limiting transistor in the current-limited oscillator 2 of this preferred embodiment. For example, when the power-supply voltage VDD is 2Vth and the voltage variations of the power-supply current limiting transistors and the GND current limiting transistors are about ½Vth, then the inverters in the delay section shown in FIG. 4 operate unsteadily at about 1Vth. By contrast, the inverters in the delay section of this preferred embodiment operate steadily, only with a voltage variation (about ½Vth) by a power-supply current limiting transistor or by a GND current limiting transistor. That is, the current-limited oscillator 2 of this preferred embodiment is capable of steadily operating even with low power-supply voltage.

Moreover, as shown in the current-limited oscillator 2 of this preferred embodiment, when a power-supply current limited inverter and a GND current limited inverter are alternately arranged in two stages or more in the delay section, the current limitations act only on the rising edges or on falling edges of the oscillator output pulse. As a result, only one of the "1" pulse width or the "0" pulse width of the oscillator output pulse is narrowed down. When a large number of inverter stages are connected, the pulse width will become so narrow that the oscillator output pulse becomes difficult to read.

Accordingly, power-supply current limited inverters and GND current limited inverters are differently arranged so that some of the inverters act on the opposite edges of the oscillator output pulse. For example, in a current-limited oscillator 2 having four stages of inverters in the delay section, the inverters are arranged not in the order of power-supply current limiting, GND current limiting, power-supply current limiting, and GND current limiting, but in the order of power-supply current limiting, GND current limiting, GND current limiting, and power-supply current limiting. Then, the preceding two stages apply current limitation to the rising edges of the oscillator output pulse and the following two stages apply current limitation to the falling edges of the oscillator output pulse.

Thus, the two inverter stages act on the rising edges of the oscillator output pulse and the two inverter stages act on its falling edges, so that the percentage of the "1" pulse width and the percentage of the "0" pulse width of the oscillator output pulse are both about 50%. Similarly, the current-limited oscillator 2 shown in FIG. 7 includes three inverter stages acting on the rising edges of the oscillator output pulse and three inverter stages acting on its falling edges, so that the percentages of the "1" pulse width and the "0" pulse width of the oscillator output pulse are both about 50%. The percentage of the "1" pulse width and the percentage of the "0" pulse width in the oscillator output pulse can be arbitrarily changed by changing the number of inverter stages acting on the rising edges of the oscillator output pulse and the number of inverter stages acting on its falling edges.

The configuration of the oscillator shown in FIG. 7 is intended to be illustrative, and the number of inverter stages in the delay section of the invention is not limited to six, and the number of inverters in each block is not particularly limited as long as it is an odd number.

Second Preferred Embodiment

Figure 9:
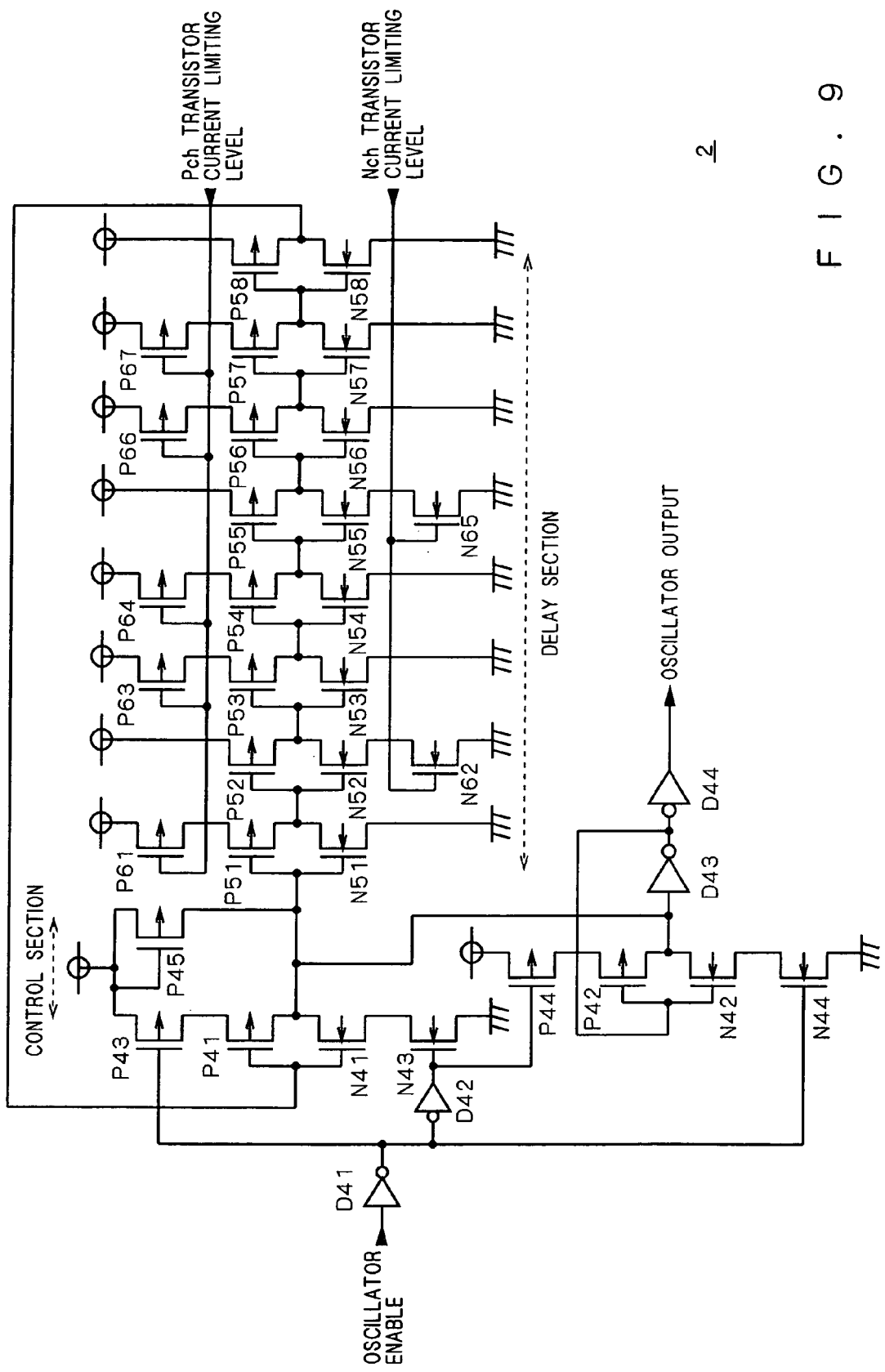
FIG. 9 is a circuit diagram of a current-limited oscillator according to a second preferred embodiment of the present invention.

FIG. 9 is a circuit diagram of a current-limited oscillator 2 according to a second preferred embodiment. In the current-limited oscillator 2 of FIG. 9, seventh-stage and eighth-stage inverters are added to the delay section of the current-limited oscillator 2 shown in FIG. 7. In the circuit diagram of FIG. 9, the same elements as those in the circuit diagram of FIG. 7 are shown at the same reference characters and are not described in detail again here.

The seventh-stage inverter is formed of a Pch transistor P57 and an Nch transistor N57, with a power-supply current limiting transistor P67 between the power supply and the Pch transistor P57. The Pch transistor current limiting level is inputted to the gate of the power-supply current limiting transistor P67. The eighth-stage inverter is formed of a Pch transistor P58 and an Nch transistor N58.

As has been described in the first preferred embodiment, process finish variations and temperature variations increase transistors' logical thresholds and delay the oscillator output, and then the period of the oscillator output varies. The variations of the period of the oscillator output can be reduced by providing a current limiting transistor to an inverter that receives an output "0" from the preceding inverter whose GND current is not limited.

When process finish variations and temperature variations are so large as to cause considerable variations of the period of the oscillator output, the variations cannot be sufficiently reduced by providing the power-supply current limiting transistors P61 and P64 to the first-stage and fourth-stage inverters as shown in the current-limited oscillator 2 of FIG. 7. Accordingly, in this preferred embodiment, the power-supply current limiting transistor P67 is connected to the seventh-stage inverter. That is, the sixth-stage inverter is not GND-current-limited, and the seventh-stage inverter that receives an output "0" thereof is provided with the current limiting transistor P67.

The provision of the seventh-stage inverter results in an odd number of stages in the delay section, and therefore the eighth-stage inverter is added in order to provide the same oscillator output.

In the current-limited oscillator 2 of this preferred embodiment, the delay section includes three portions (P61, P64 and P67) in which a current limiting transistor is provided for an inverter that receives an output "0" from the preceding inverter whose GND current is not limited, which enhances the effect of reducing the variations of the period of the oscillator output caused by process finish variations and temperature variations.

Third Preferred Embodiment

Figure 10:
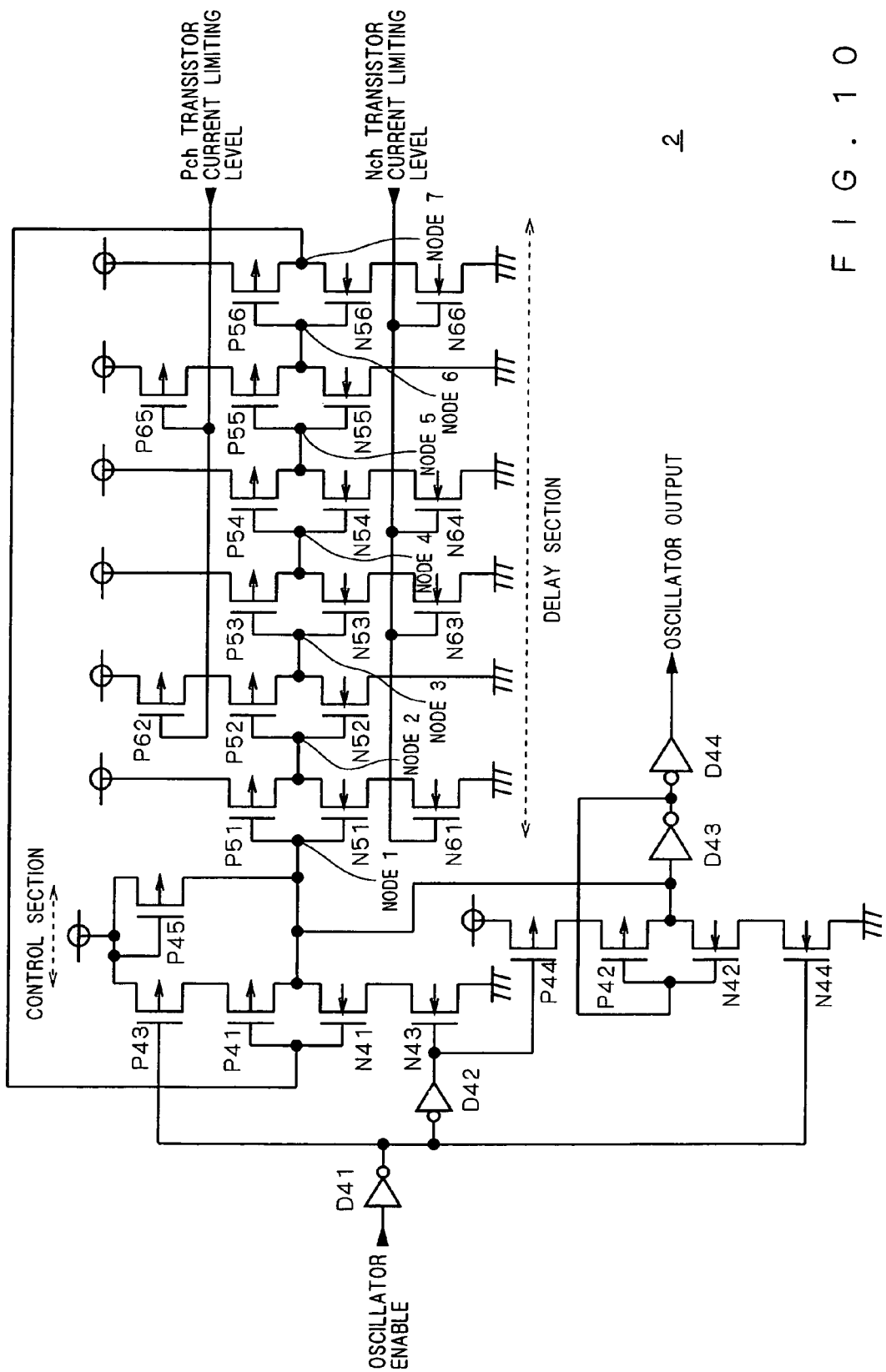
FIG. 10 is a circuit diagram of a current-limited oscillator according to a third preferred embodiment of the present invention.

FIG. 10 is a circuit diagram of a current-limited oscillator 2 according to a third preferred embodiment. The current-limited oscillator 2 shown in FIG. 10 differs from the current-limited oscillator 2 of FIG. 7 in the configuration of the current limiting transistors provided to the inverters in the delay section. In the circuit diagram of FIG. 10, the same elements as those in the circuit diagram of FIG. 7 are shown at the same reference characters and are not described in detail again here.

In the delay section of the current-limited oscillator 2 shown in FIG. 10, the first-stage inverter is provided with a GND current limiting transistor N61, the second-stage inverter is provided with a power-supply current limiting transistor P62, the third-stage inverter is provided with a GND current limiting transistor N63, the fourth-stage inverter is provided with a GND current limiting transistor N64, the fifth-stage inverter is provided with a power-supply current limiting transistor P65, and the sixth-stage inverter is provided with a GND current limiting transistor N66.

In the current-limited oscillator 2 of this preferred embodiment, the delay section is configured as shown in FIG. 10 so that the third-stage inverter provided only with the GND current limiting transistor and the fourth-stage inverter provided only with the GND current limiting transistor are contiguous with each other. A "0" to "1" output of the third-stage inverter rapidly varies because its power-supply current is not limited. Then, the charge stored in the drain of the GND current limiting transistor N64 while the Nch transistor N54 of the fourth-stage inverter is OFF is rapidly discharged as the Nch transistor N54 rapidly turns on. Thus, the relation between the third stage and the fourth stage reduces the oscillator output delay effect.

This relation can be utilized to prevent the problem that the period of the oscillator output varies when the oscillator output is delayed by an increase in the transistor logical threshold caused by process finish variations and temperature variations. The variations of the period of the oscillator output can be minimized by adjusting the drain capacitance of the GND current limiting transistor N64 by adjusting the size of the GND current limiting transistor N64. The relation between the third stage and the fourth stage can be similarly applied to the relation between the zeroth stage and the first stage.

The relation between the third stage and the fourth stage is generalized as provision of a GND current limiting transistor to an inverter that follows an inverter whose power-supply current is not limited and that is supplied with "1" as a high potential. Applying this relation to the delay section reduces the variations of the period of the oscillator output that are caused by process finish variations and temperature variations.

Fourth Preferred Embodiment

Figure 11:
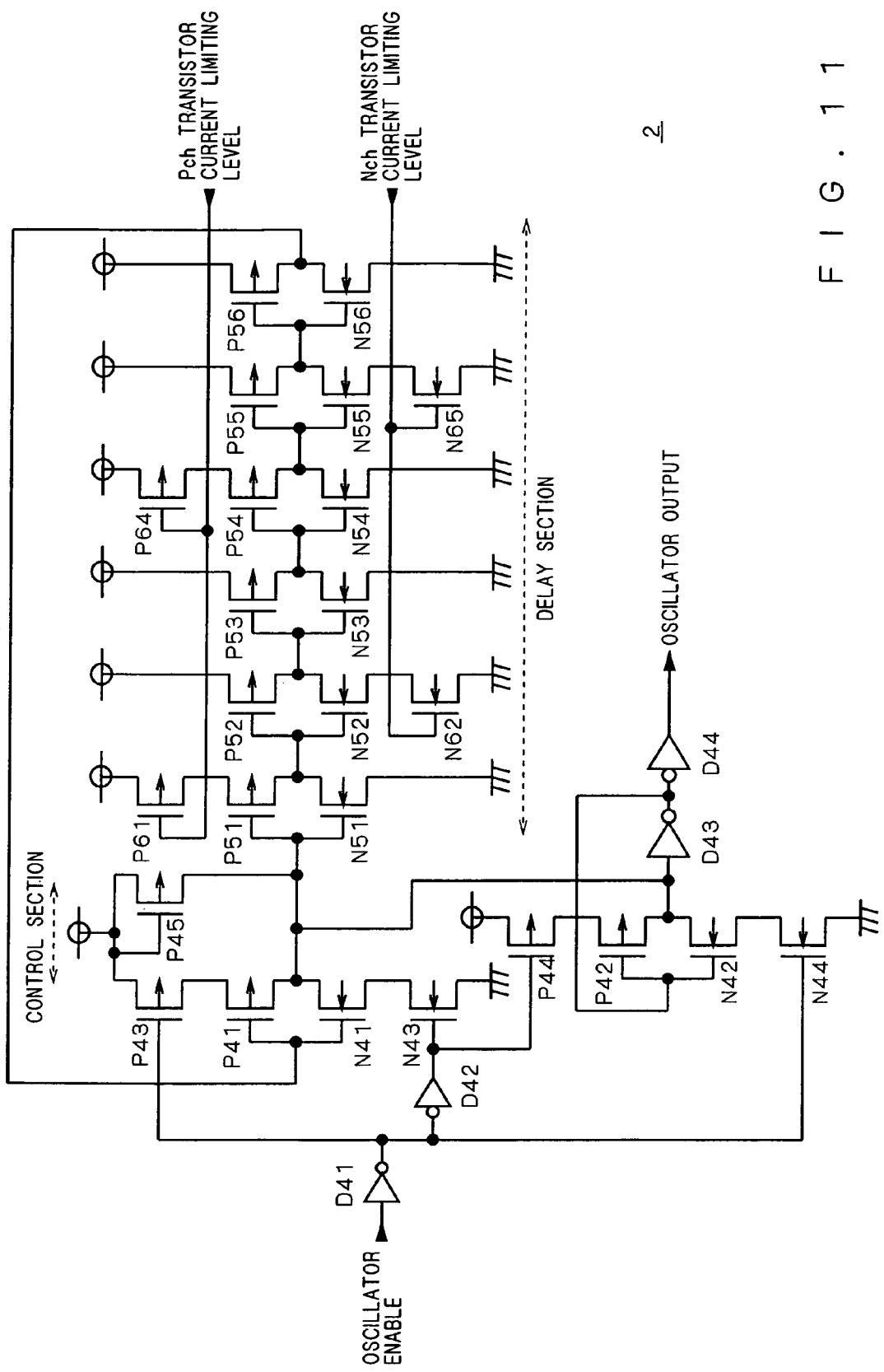
FIG. 11 is a circuit diagram of a current-limited oscillator according to a fourth preferred embodiment of the present invention.

FIG. 11 is a circuit diagram of a current-limited oscillator 2 according to a fourth preferred embodiment. The current-limited oscillator 2 of FIG. 11 differs from the current-limited oscillator 2 shown in FIG. 7 in the configuration of the current limiting transistors provided for the inverters in the delay section. In the circuit diagram of FIG. 11, the same elements as those in the circuit diagram of FIG. 7 are shown at the same reference characters and are not described in detail here again.

In the delay section of the current-limited oscillator 2 shown in FIG. 11, the first-stage inverter is provided with a power-supply current limiting transistor P61, the second-stage inverter is provided with a GND current limiting transistor N62, the fourth-stage inverter is provided with a power-supply current limiting transistor P64, and the fifth-stage inverter is provided with a GND current limiting transistor N65.

In the current-limited oscillator 2 shown in FIG. 11, the number of current-limited inverter stages is smaller by two than that of the current-limited oscillator 2 shown in FIG. 7. Accordingly, the current-limited oscillator 2 of FIG. 11 provides a smaller delay effect than the current-limited oscillator 2 of FIG. 7. The power-supply current limiting transistors P61 and P64 of the first-stage and fourth-stage inverters are power-supply current limiting transistors that are connected to inverters that receive "0" outputs from the preceding inverters whose GND currents are not limited. Accordingly, the current-limited oscillator 2 of this preferred embodiment, too, is capable of reducing the variations of the period of the oscillator output caused by process finish variations and temperature variations.

Thus, in the current-limited oscillator 2 of this preferred embodiment, the delay section is configured as shown in FIG. 11 and has two portions in which an inverter provided with a transistor that limits only the power-supply current and an inverter provided with a transistor that limits only the GND current are contiguous with each other, and it is possible to enlarge the delay effect by varying the logical thresholds as in the current-limited oscillator 2 shown in FIG. 4. Also, the inverters in the delay section of this preferred embodiment are provided only with a transistor that limits only the power-supply current or with a transistor that limits only the GND current. Accordingly, the current-limited oscillator 2 of this preferred embodiment is capable of more steadily operating even when it is driven with low power-supply voltage, as compared with the current-limited oscillator 2 shown in FIG. 4.

Fifth Preferred Embodiment

Figure 12:
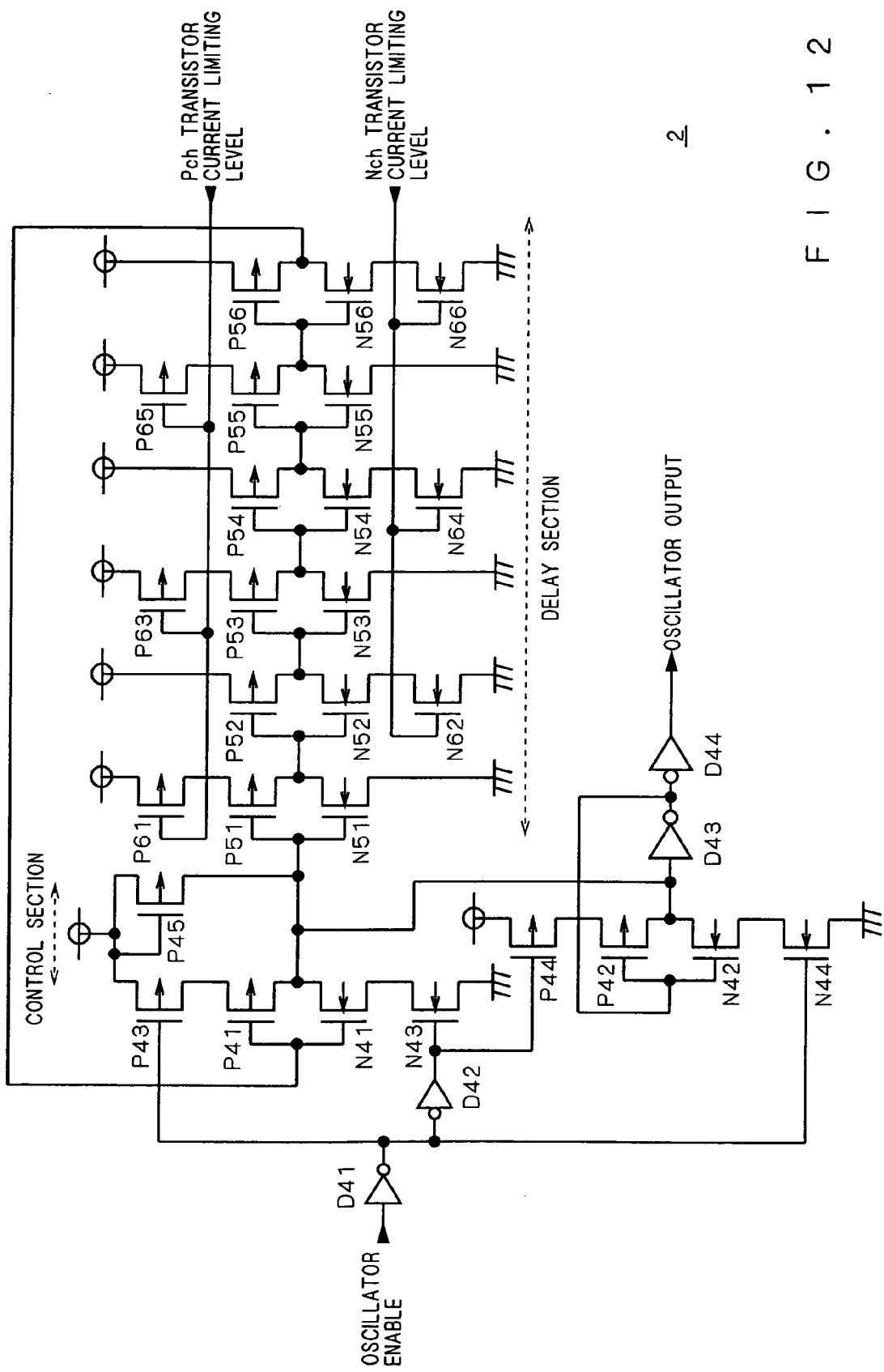
FIG. 12 is a circuit diagram of a current-limited oscillator according to a fifth preferred embodiment of the present invention.

FIG. 12 is a circuit diagram of a current-limited oscillator 2 according to a fifth preferred embodiment. The current-limited oscillator 2 of FIG. 12 differs from the current-limited oscillator 2 shown in FIG. 7 in the configuration of the current limiting transistors provided to the inverters in the delay section. In the circuit diagram of FIG. 12, the same elements as those in the circuit diagram of FIG. 7 are shown at the same reference characters and are not described in detail here again.

In the delay section of the current-limited oscillator 2 of FIG. 12, the first-stage inverter is provided with a power-supply current limiting transistor P61, the second-stage inverter is provided with a GND current limiting transistor N62, the third-stage inverter is provided with a power-supply current limiting transistor P63, the fourth-stage inverter is provided with a GND current limiting transistor N64, the fifth-stage inverter is provided with a power-supply current limiting transistor P65, and the sixth-stage inverter is provided with a GND current limiting transistor N66. That is, in the delay section of this preferred embodiment, inverters provided with transistors that limit only the power-supply current and inverters provided with transistors that limit only the GND current are alternately arranged. Accordingly, the configuration of the current-limited oscillator 2 of this preferred embodiment delays the rising portions of the oscillator output pulse.

Thus, in the current-limited oscillator 2 of this preferred embodiment, the delay section is configured as shown in FIG. 12 and inverters provided only with a power-supply current limiting transistor and inverters provided only with a GND current limiting transistor are arranged alternately, and it is possible to further enhance the delay effect by varying the logical thresholds as in the current-limited oscillator 2 shown in FIG. 4. Also, each inverter in the delay section of this preferred embodiment is provided only with a transistor that limits only the power-supply current or with a transistor that limits only the GND current. Accordingly, the current-limited oscillator 2 of this preferred embodiment is capable of more steadily operating even when it is driven with low power-supply voltage, as compared with the current-limited oscillator 2 shown in FIG. 4.

Sixth Preferred Embodiment

Figure 13:
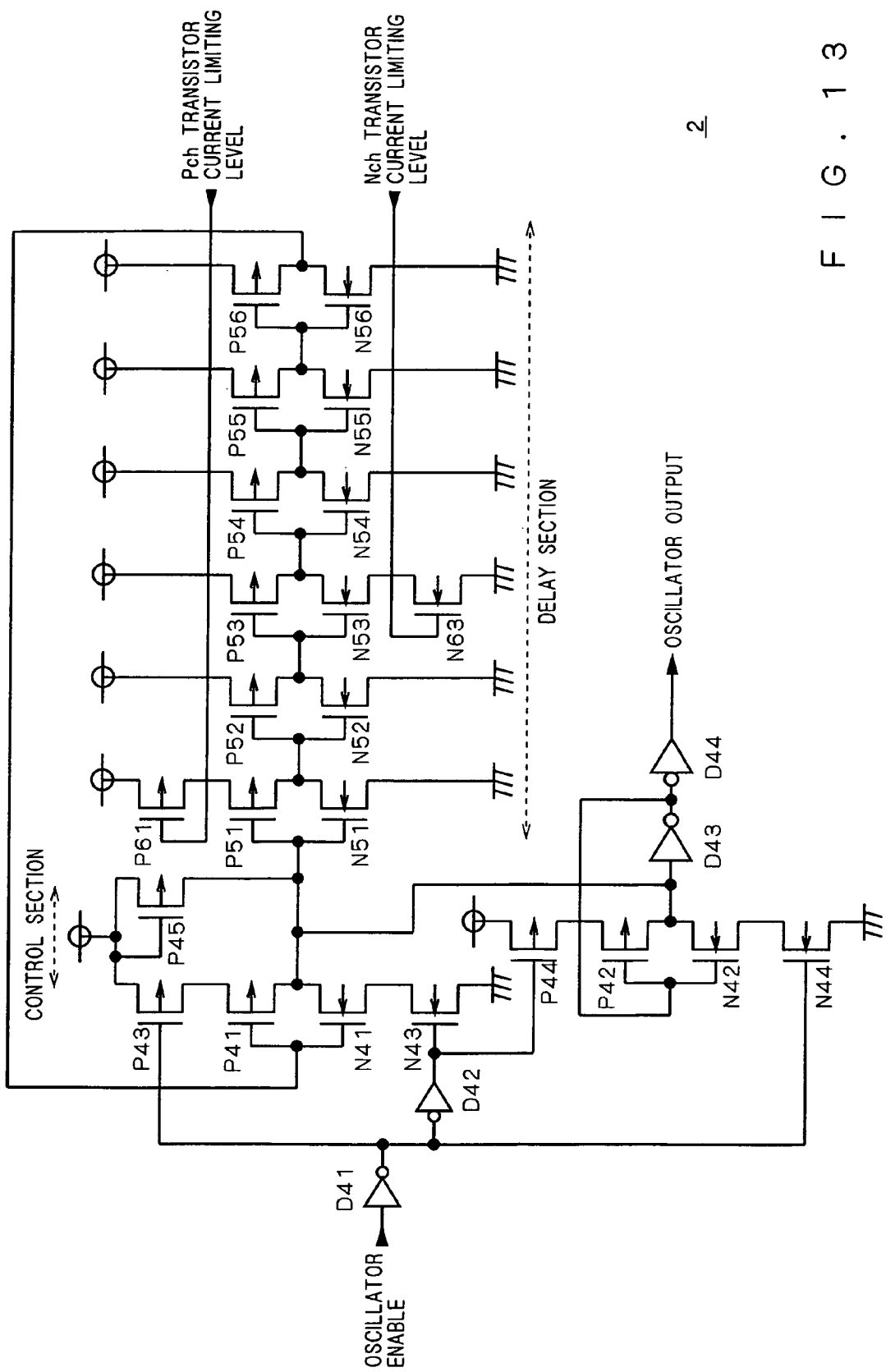
FIG. 13 is a circuit diagram of a current-limited oscillator according to a sixth preferred embodiment of the present invention.

FIG. 13 is a circuit diagram of a current-limited oscillator 2 according to a sixth preferred embodiment. The current-limited oscillator 2 of FIG. 13 differs from the current-limited oscillator 2 shown in FIG. 7 in the configuration of the current limiting transistors provided for the inverters in the delay section. In the circuit diagram of FIG. 13, the same elements as those in the circuit diagram of FIG. 7 are shown at the same reference characters and are not described in detail here again.

In the delay section of the current-limited oscillator 2 shown in FIG. 13, the first-stage inverter is provided with a power-supply current limiting transistor P61, and the third-stage inverter is provided with a GND current limiting transistor N63. That is, the delay section of the current-limited oscillator 2 of this preferred embodiment includes one inverter stage that is provided with a transistor that limits only the power-supply current and one inverter stage provided with a transistor that limits only the GND current.

As compared with the current-limited oscillator 2 shown in FIG. 7, the current-limited oscillator 2 of this preferred embodiment is effective when there is no need to provide a large oscillator output delay effect. Also, each of the two inverters in the delay section of this preferred embodiment is provided only with a power-supply current limiting transistor or with a GND current limiting transistor. Accordingly, the current-limited oscillator 2 of this preferred embodiment is capable of steadily operating even when it is driven with low power-supply voltage, as compared with the current-limited oscillator 2 shown in FIG. 4. Also, the current-limited oscillator 2 of FIG. 12 includes one inverter in the first stage that acts on the rising-edges of the oscillator output pulse and one inverter in the third stage that acts on the falling edges of the oscillator output pulse, so that the percentage of the "1" pulse width and the percentage of the "0" pulse width of the oscillator output pulse are both about 50%.

Seventh Preferred Embodiment

Figure 14:
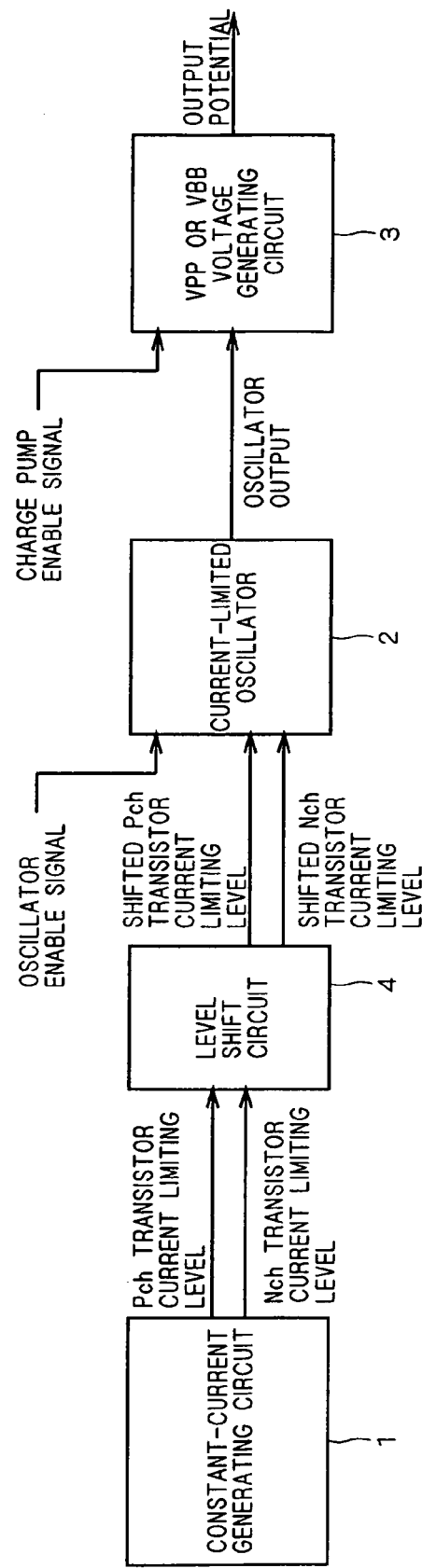
FIG. 14 is a circuit diagram of a charge pump circuit according to a seventh preferred embodiment of the present invention.

FIG. 14 is a block diagram of a charge pump circuit according to a seventh preferred embodiment. The charge pump circuit of FIG. 14 includes a level shift circuit 4 between the constant-current generating circuit 1 and the current-limited oscillator 2 in the charge pump circuit shown in FIG. 1. The level shift circuit 4 of this preferred embodiment shifts to given levels the Pch transistor current limiting level and the Nch transistor current limiting level supplied from the constant-current generating circuit 1. Then, the level shift circuit 4 of this preferred embodiment supplies the level-shifted Pch transistor current limiting level and the level-shifted Nch transistor current limiting level to the current-limited oscillator 2.

Figure 15:
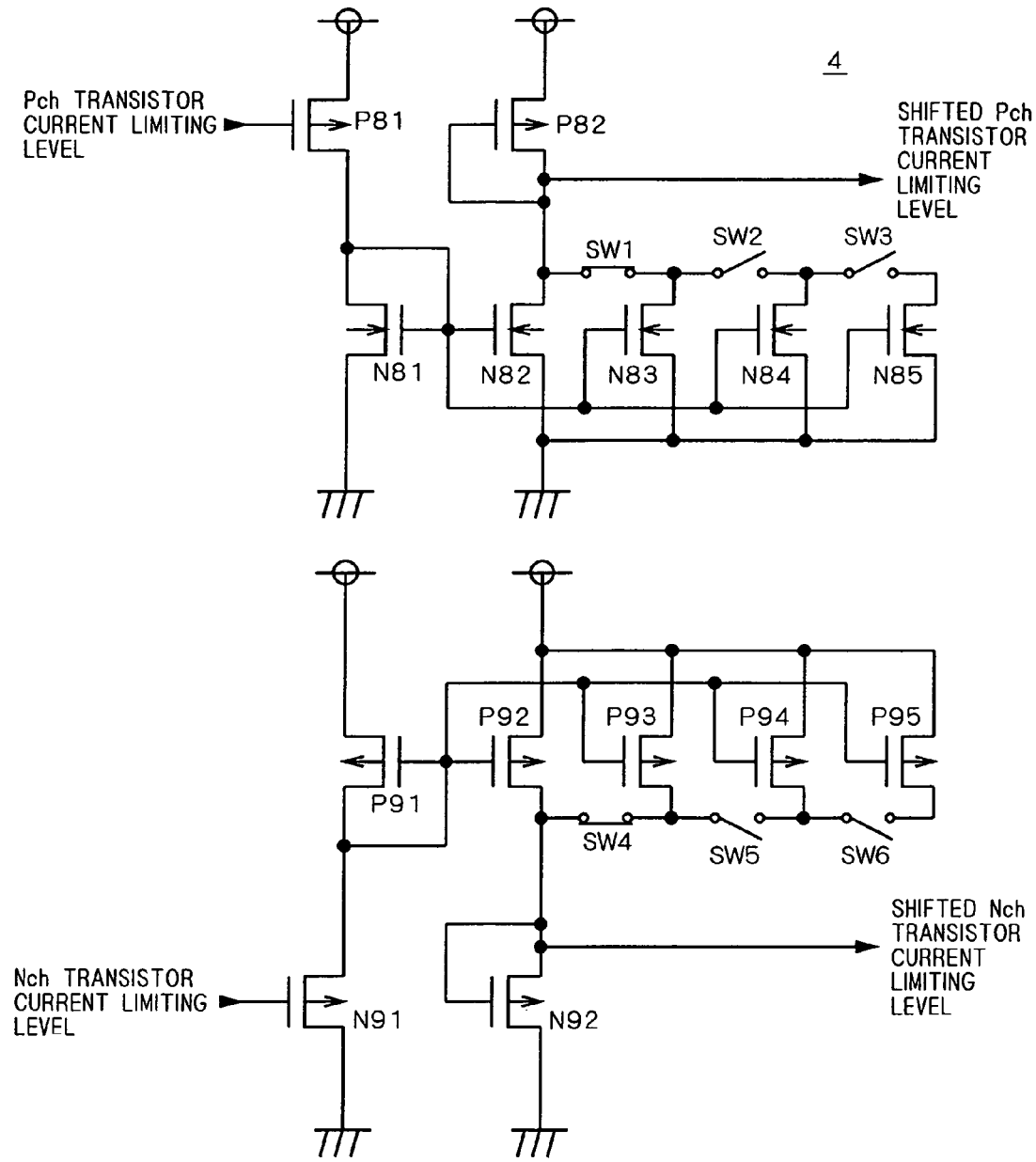
FIG. 15 is a circuit diagram of a level shift circuit according to the seventh preferred embodiment of the present invention.

FIG. 15 is a circuit diagram of the level shift circuit 4 according to this preferred embodiment. The level shift circuit 4 of FIG. 15 can be divided into a section that shifts the Pch transistor current limiting level and a section that shifts the Nch transistor current limiting level. The section for shifting the Pch transistor current limiting level includes a Pch transistor P81 and an Nch transistor N81 between the power supply and GND, where the Pch transistor current limiting level is inputted to the gate of the Pch transistor P81. The gate of the Nch transistor N81 is connected to the gate of an Nch transistor N82, and the drain of the Nch transistor N82 is connected to the drain of an Nch transistor N83 through a switch SW1.

The drain of the Nch transistor N83 is disconnected from the drain of an Nch transistor N84 through a switch SW2, and the drain of the Nch transistor N84 is disconnected from the drain of an Nch transistor N85 through a switch SW3. The drain of the Nch transistor N82 is connected also with the drain of a Pch transistor P82, and the source of the Pch transistor N82 is connected to the power supply. The Pch transistor current limiting level can be shifted to arbitrary levels by arbitrarily switching the switches SW1 to SW3. The shifted Pch transistor current limiting level is outputted from the drain of the Nch transistor N82.

The section for shifting the Nch transistor current limiting level includes a Pch transistor P91 and an Nch transistor N91 between the power supply and GND, where the Nch transistor current limiting level is inputted to the gate of the Nch transistor N91. The gate of the Pch transistor P91 is connected to the gate of a Pch transistor P92, and the drain of the Pch transistor P92 is connected to the drain of a Pch transistor P93 through a switch SW4.

The drain of the Pch transistor P93 is disconnected from the drain of a Pch transistor P94 through a switch SW5, and the drain of the Pch transistor P94 is disconnected from the drain of a Pch transistor P95 through a switch SW6. The drain of the Pch transistor P92 is connected also with the drain of an Nch transistor N92, and the source of the Nch transistor N92 is connected to the GND. The Nch transistor current limiting level can be shifted to arbitrary levels by arbitrarily switching the switches SW4 to SW6. The shifted Nch transistor current limiting level is outputted from the drain of the Pch transistor P92.

Thus, the charge pump circuit of this preferred embodiment has the level shift circuit 4 and is therefore capable of increasing and decreasing the currents flowing to the current limiting transistors by turning on/off the switches SW1 to SW6. That is, the charge pump circuit of this preferred embodiment is capable of varying the oscillator output delay effect by varying the current limiting levels, and thus capable of readily varying the period of the oscillator output.

The level shift circuit 4 of FIG. 15 uses six switches SW1 to SW6 in total, including three switches for shifting the Pch transistor current limiting level and three for shifting the Nch transistor current limiting level. However, the present invention is not limited to this configuration and the number of switches is determined according to the required shift levels.

Eighth Preferred Embodiment

First, the output delay of the current-limited oscillator 2 shown in FIG. 7 will be specifically described. Before that, see FIG. 16 that shows a current-limited oscillator 2 configured similarly to the current-limited oscillator 2 of FIG. 7 but having no current limiting transistors, and the output delay of this current-limited oscillator 2 will be described. In the current-limited oscillator 2 shown in FIG. 16, the delay-section includes six stages of inverters (Pch transistors P51 to P56 and Nch transistors N51 to N56). The logical threshold of the Pch transistors P51 to P56 is 0.8 V and the logical threshold of the Nch transistors N51 to N56 is 0.4 V.

Figure 16:
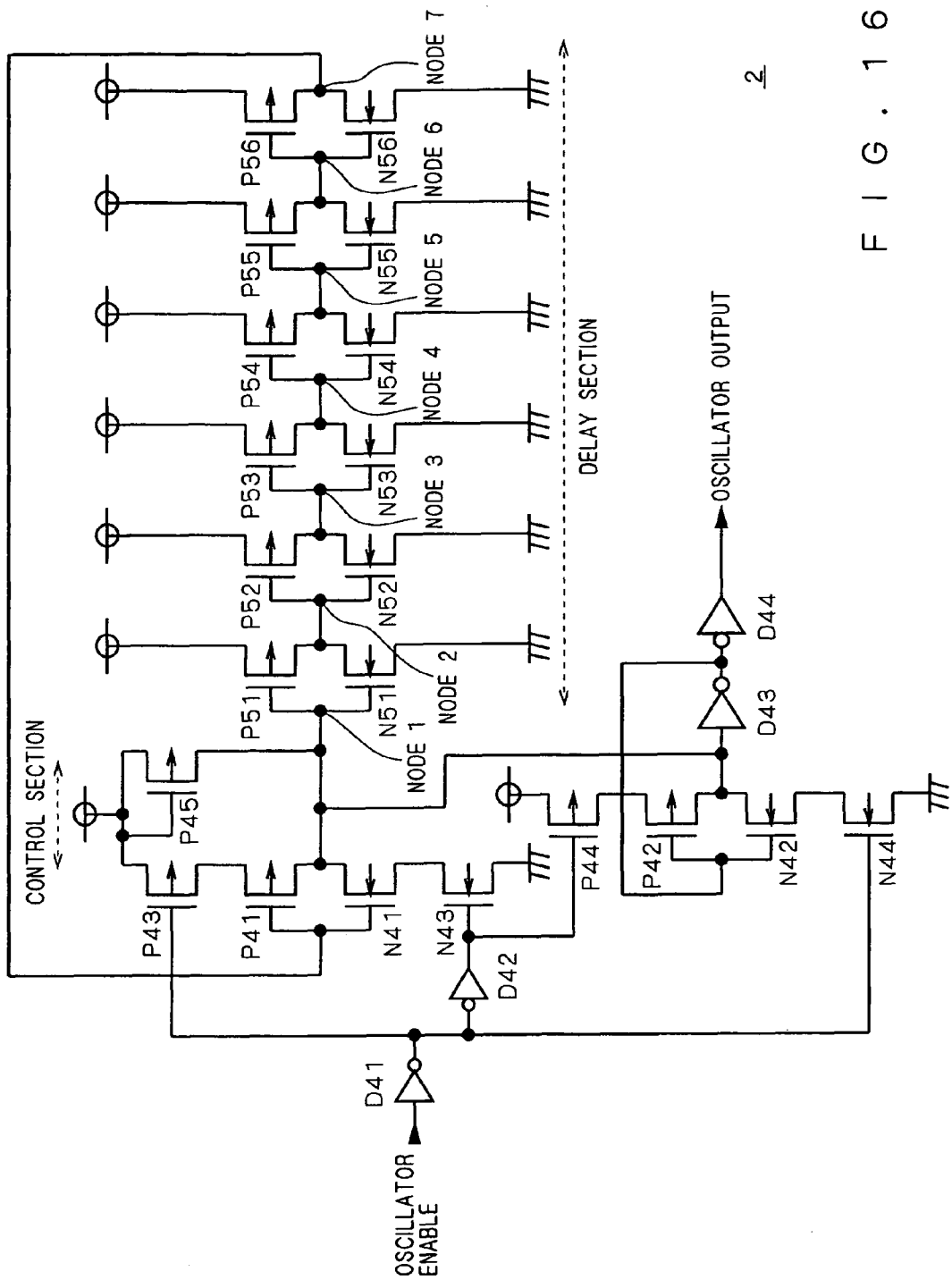
FIG. 16 is a circuit diagram of a conventional current-limited oscillator used to describe a current-limited oscillator according to an eighth preferred embodiment of the present invention.
Figure 17:
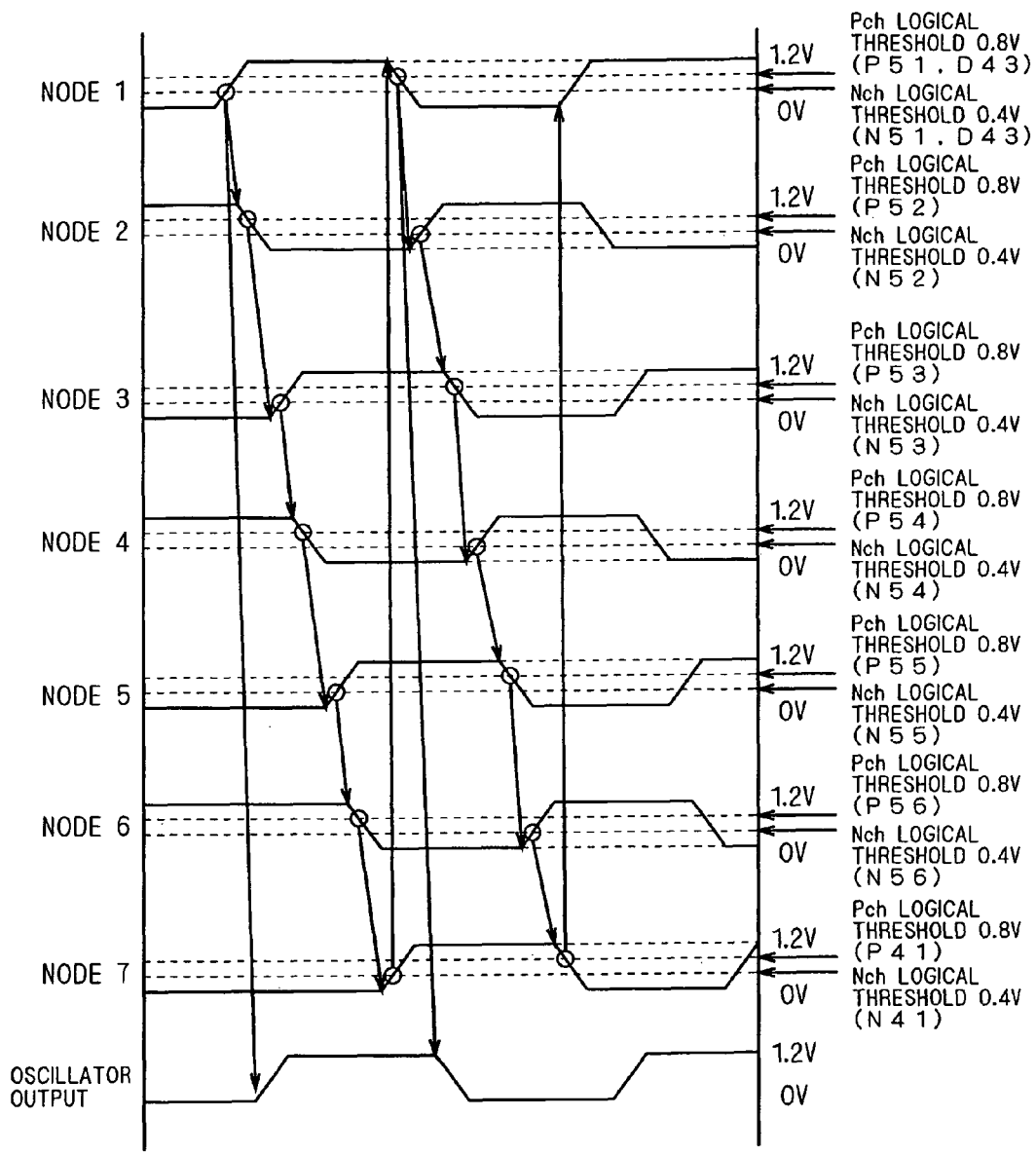
FIG. 17 is a waveform diagram of the conventional current-limited oscillator used to describe the current-limited oscillator according to the eighth preferred embodiment of the present invention.

FIG. 17 shows the waveforms at the nodes 1 to 7 and the waveform of the oscillator output of the current-limited oscillator 2 shown in FIG. 16. The waveforms of FIG. 17 are not the actual waveforms of the current-limited oscillator 2 of FIG. 16, but are part of the waveforms illustrated for the purpose of description of the output delay. As is known from the waveforms shown in FIG. 17, in the current-limited oscillator 2 of FIG. 16, the logical thresholds of the Pch transistors P51 to P56 are fixed at 0.8 V and the logical thresholds of the Nch transistors N51 to N56 are also fixed at 0.4 V. Accordingly, in the current-limited oscillator 2 of FIG. 16, the amounts of delay in the individual inverters are almost equal as shown in FIG. 17.

On the other hand, with the current-limited oscillator 2 shown in FIG. 7, the presence of the current limiting transistors (the power-supply current limiting transistors P61, P63, P64, P66 and the GND current limiting transistors N62, N65) varies the logical thresholds of the Pch transistors P51 to P56 and the Nch transistors N51 to N56. That is, when the power-supply current limiting transistors P61, P63, P64, P66 turn on in a transient region, the power-supply current limiting transistors P61, P63, P64, P66 cause a voltage drop of, e.g., about ½Vth, in the inverters in the delay section to which they respectively supply power. Accordingly, the logical thresholds of the Pch transistors P51, P53, P54 and P56 fall to 0.6 V, while the logical thresholds of the Nch transistors N51, N53, N54 and N56 remain unchanged at 0.4 V.

Also, the GND current limiting transistors N62 and N65 cause a voltage increase of, e.g., ½Vth, in the inverters in the delay section to which they respectively supply GND. Accordingly, the logical thresholds of the Nch transistors N52 and N55 rise to 0.6 V, while the logical thresholds of the Pch transistors P52 and P55 remain unchanged at 0.8 V.

Figure 18:
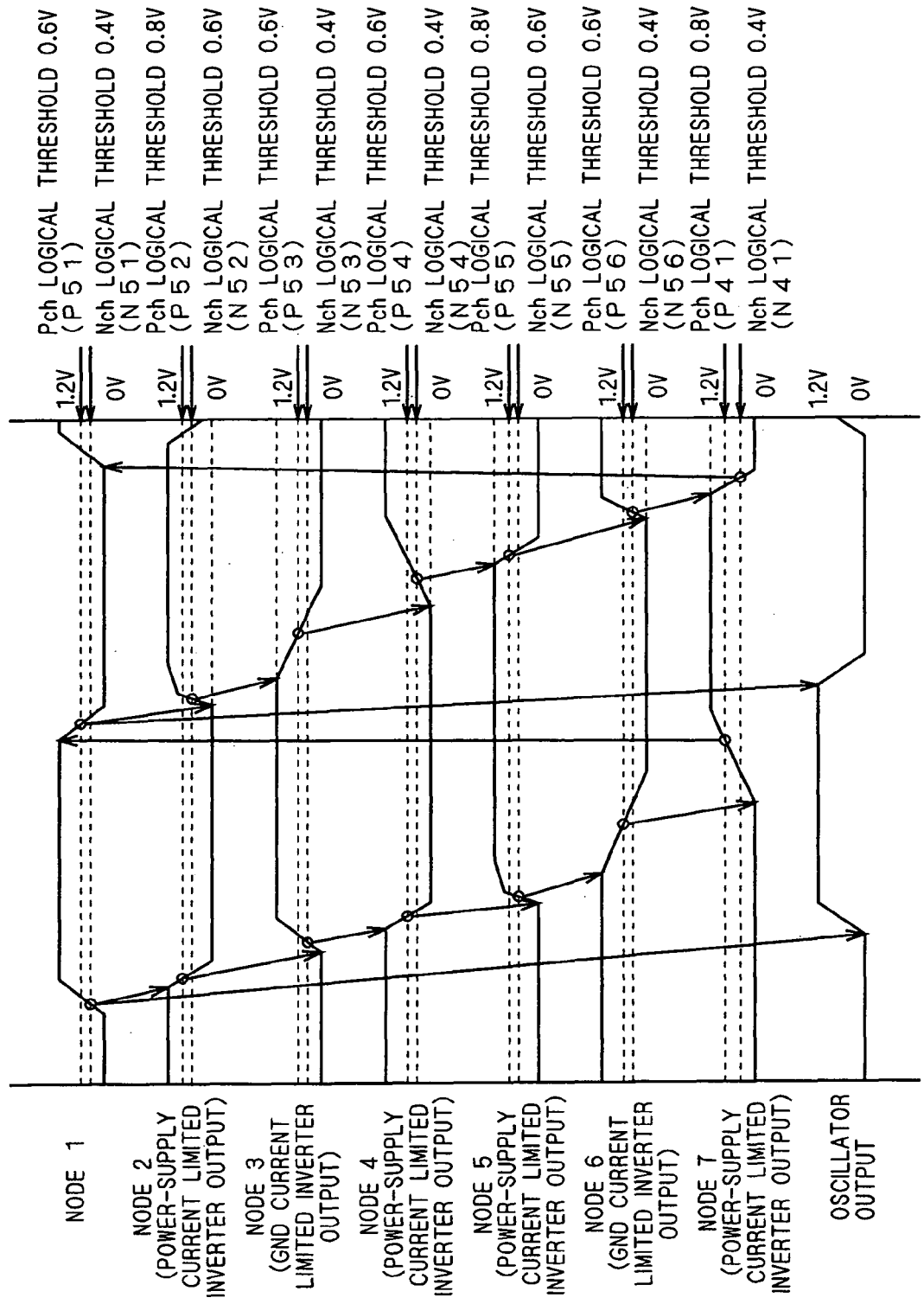
FIG. 18 is a waveform diagram used to describe the current-limited oscillator according to the eighth preferred embodiment of the present invention.

FIG. 18 shows the waveforms of the nodes 1 to 7 and the waveform of the oscillator output to describe the output delay of the current-limited oscillator 2 shown in FIG. 7. The waveforms shown in FIG. 18 are part of the actual waveforms of the current-limited oscillator 2 of FIG. 7 illustrated for the purpose of describing the output delay. In the waveforms shown in FIG. 18, unlike in the waveforms shown in FIG. 17, the logical thresholds of the Pch transistors P51, P53, P54 and P56, whose power-supply currents are limited, fall from 0.8 V to 0.6 V, and the logical thresholds of the Nch transistors N52 and N55 rise from 0.4 V to 0.6 V.

With the waveforms shown in FIG. 18, the falling edge of the node 2, the rising edge of the node 3, and the falling edge of the node 4 that correspond to the rising edge of the node 1 are not current-limited, and therefore the amounts of delay at these edges are not very different from those of the waveforms shown in FIG. 17. Next, as for the rising edge of the node 2 that corresponds to the falling edge of the node 1, the waveform rapidly rises as shown by the waveform of the node 2 in FIG. 18, because of rapid discharge from the drain capacitance of the power-supply current limiting transistor P61 as described in the first preferred embodiment. With the rapid rise of the waveform, the threshold of the Nch transistor N52 is reached in a short time, and so the rising edge of the node 2 corresponding to the falling edge of the node 1 is not greatly delayed.

Next, as for the falling edge of the node 3 that corresponds to the falling edge of the node 1, while the node 3 starts falling after the rise at the node 2 has reached the threshold of the Nch transistor N52, it falls slowly because of the GND limiting by the GND current limiting transistor N62. Also, the power-supply current limiting transistor P63 causes the logical threshold of the next-stage Pch transistor P53 to fall from 0.8 V to 0.6 V, and so the fall at the node 3 takes time to reach the threshold, which efficiently increases the amount of delay of the edge.

Also, in the waveforms shown in FIG. 18, the rising edge of the node 6 and the falling edge of the node 7 that correspond to the falling edge of the node 5 are not current-limited, and therefore the amounts of delay at these edges are not very different from those of the waveforms shown in FIG. 17. Next, as for the rising edge of the node .5, the waveform rapidly rises as shown by the waveform of the node 5 in FIG. 18, because of rapid discharge from the drain capacitance of the power-supply current limiting transistor P64 as described in the first preferred embodiment. With the rapid rise of the waveform, the threshold of the Nch transistor N55 is reached in a short time, and so the rising edge of the node 5 is not greatly delayed.

Next, as for the falling edge of the node 6 that corresponds to the rising edge of the node 5, the node 6 starts falling after the rise at the node 5 has reached the threshold of the Nch transistor N55, and it falls slowly because of the GND limiting by the GND current limiting transistor N65. Also, the power-supply current limiting transistor P66 causes the logical threshold of the next-stage Pch transistor P56 to fall from 0.8 V to 0.6 V, and so the fall at the node 6 takes time to reach the threshold, which efficiently increases the amount of delay of the edge.

In this way, in the current-limited oscillator 2 of FIG. 7, delays occur as shown in FIG. 18 at the edges of the nodes that correspond to the falling edge of the node 1 and the edges of the nodes that correspond to the rising edge of the node 5, so that the percentage of the "1" pulse width and the percentage of the "0" pulse width of the oscillator output pulse are both about 50%. With the current-limited oscillator 2 shown in FIG. 10, the waveform pattern, though not shown, is a reverse of that shown in FIG. 18.

As described so far, the current-limited oscillator 2 of FIG. 7 adjusts the amounts of delay by providing the power-supply current limiting transistors P61, P63, P64, P66 and the GND current limiting transistors N62, N65. That is, in the current-limited oscillator 2 of FIG. 7, the power-supply current limiting transistors P61, P63, P64, P66 and the GND current limiting transistors N62, N65 vary the amounts of currents supplied to the inverters in the delay section to adjust the amounts of delay. The amounts of current by the power-supply current limiting transistors P61, P63, P64, P66 and the GND current limiting transistors N62, N65 can be varied by adjusting the channel lengths (hereinafter referred to as "L") and the transistor sizes (hereinafter "W"). The transistor size W is also called "channel width".

With the power-supply current limiting transistors P61, P63, P64, P66 and the GND current limiting transistors N62, N65, the amount of current can be more limited to enlarge the amount of delay by enlarging L or by reducing W. L may be enlarged and W may be reduced at the same time, with the power-supply current limiting transistors P61, P63, P64, P66 and the GND current limiting transistors N62, N65. As for the inverters in the delay section (the Pch transistors P51 to P56 and the Nch transistors N51 to N56), the amount of delay can be increased by making L larger than that of other logic transistors (e.g., the Pch transistor P43).

More specifically, with the Pch transistors P51 to P56 and the Nch transistors N51 to N56 forming the inverters in the delay section, the L is about 0.4 μm, while the L of the power-supply current limiting transistors P61, P63, P64, P66 and the GND current limiting transistors N62, N65 is as large as about 1 to 2 μm. The L of other logic transistors is about 0.1 μm. Also, while the W of the Pch transistors P51 to P56 and the Nch transistors N51 to N56 is about 2 to 4 μm, the W of the GND current limiting transistors N62 and N65 is as small as about 1 to 2 μm.

However, the W of the power-supply current limiting transistors P61, P63, P64, P66 is about 20 to 30 μm, which is larger than the W of the Pch transistors P51 to P56 and the Nch transistors N51 to N56. This is because, when the W of the power-supply current limiting transistor P61 is small, for example, the drain capacitance of the power-supply current limiting transistor P61 is small, and therefore the rapidly rising portion is shorter as shown by the waveform of FIG. 19. Then, the delay time will considerably vary due to the influence of a threshold variation of the Nch transistor N52. That is, while the threshold of the Nch transistor N52 varies because of process finish variations and temperature variations, the delay time of the falling edge at the node 3 varies considerably if a threshold variation occurs in the slowly rising portion as shown in FIG. 19.

Accordingly, in this preferred embodiment, the W of the power-supply current limiting transistor P61 is set at about 20 to 30 μm, which is about five times or more larger than the W of the Pch transistor P51 etc. This enlarges the drain capacitance of the power-supply current limiting transistor P61 and lengthens the rapidly rising portion, and then the variation of the threshold of the Nch transistor N52 is included in the rapidly rising portion. As shown in FIG. 20, the variation of the threshold of the Nch transistor N52 occurs within the rapidly rising portion at the node 2, which reduces the variation of the delay time of the falling edge at the node 3.

Like the power-supply current limiting transistor P61, the power-supply current limiting transistor P64 rapidly discharges from the drain capacitance to cause a rapid rise of the waveform. Accordingly, it is necessary to set the W of the power-supply current limiting transistor P64 at about 20 to 30 μm, or about five times or more larger than the W of the Pch transistor P51 and the like. P The principle on which the power-supply current limiting transistor P64 reduces variations of the delay time will be described. First, the third-stage inverter (the Pch transistor P53 and the Nch transistor N53) is not current-limited about GND. When a "0" output from the third-stage inverter is inputted to the fourth-stage inverter provided with the power-supply current limiting transistor P64, the Pch transistor P54 turns on in a short time and the positive charge stored in the sufficiently large drain capacitance of the power-supply current limiting transistor P64 is rapidly discharged. Then, even when the threshold of the Nch transistor N55 forming the fifth-stage inverter is high or low due to process variation or temperature variation, the input potential reaches the threshold in a short time and the delay time variation is suppressed, and the inverter in the next stage outputs "0".

As for the power-supply current limiting transistors P63 and P66, which are not configured the same as the power-supply current limiting transistors P61 and P64, their W may be set small to make the circuit size small. However, it is desirable to set the W of the power-supply current limiting transistors P63 and P66 equal to that of the power-supply current limiting transistors P61 and P64 because they are driven by the same Pch transistor current limiting level. While the description above has mentioned that the W of the power-supply current limiting transistors P61 and P64 is five times or more, it can be twice, at least, as long as the necessary drain capacitance is ensured.

Next, the current-limited oscillator 2 shown in FIG. 10 will be described, where the configuration of the current limiting transistors is a reverse of that of the current-limited oscillator 2 shown in FIG. 7.

The current-limited oscillator 2 shown in FIG. 10, too, adjusts the amounts of delay by providing the power-supply current limiting transistors P62, P65 and the GND current limiting transistors N61, N63, N64, N66. Also, the amounts of current by the power-supply current limiting transistors P62 and P65 and the GND current limiting transistors N61, N63, N64, N66 can be varied by adjusting L and W.

Specifically, with the Pch transistors P51 to P56 and the Nch transistors N51 to N56 forming the inverters in the delay section, the L is about 0.4 µm, while the L of the power-supply current limiting transistors P62, P65 and the GND current limiting transistors N61, N63, N64, N66 is as large as about 1 to 2 µm. The L of other logic transistors is about 0.1 µm. Also, while the W of the Pch transistors P51 to P56 and the Nch transistors N51 to N56 is about 2 to 4 µm, the W of the power-supply current limiting transistors P62 and P65 is as small as about 1 to 2 µm.

Figure 21:
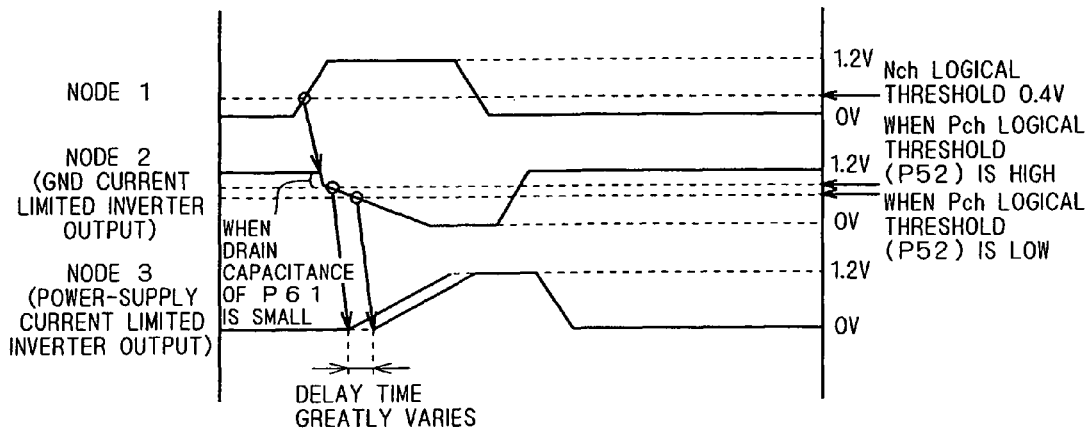

However, the W of the GND current limiting transistors N61, N63, N64, N66 is about 20 to 30 µm, which is larger than the W of the Pch transistor P51 and the like. This is because, when the W of the GND current limiting transistor N61 is small, for example, the drain capacitance of the GND current limiting transistor N61 is small, and therefore the rapidly falling portion is shorter as shown by the waveform of FIG. 21. Then, the delay time will be considerably varied by the influence of a threshold variation of the Pch transistor P52. That is, while the threshold of the Pch transistor P52 varies because of process finish variations and temperature variations, the delay time of the rising edge at the node 3 considerably varies if a threshold variation occurs in the slowly falling portion as shown in FIG. 21.

Figure 22:
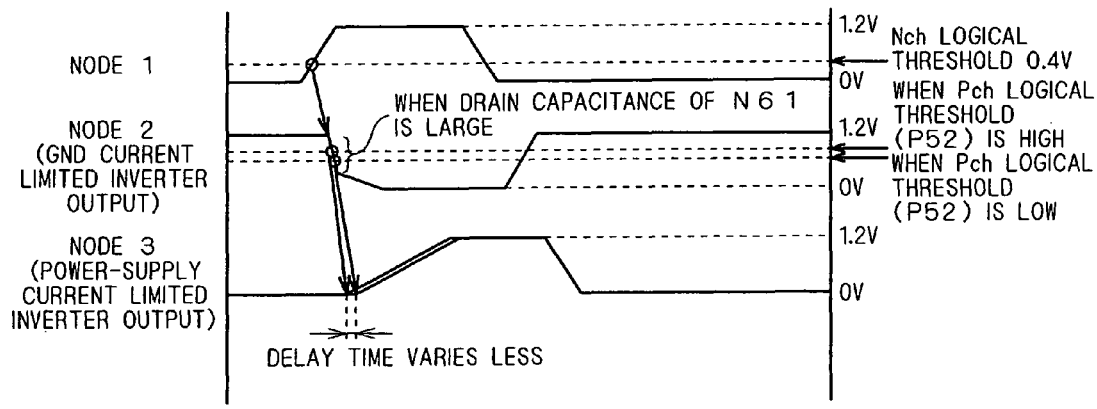

Accordingly, in this preferred embodiment, the W of the GND current limiting transistor N61 is set at about 20 to 30 µm, which is about five times or more larger than the W of the Pch transistor P51 and the like. This enlarges the drain capacitance of the GND current limiting transistor N61 and lengthens the rapidly falling portion. Then, the variation of the threshold of the Pch transistor P52 is included in the rapidly falling portion. As shown in FIG. 22, even when the threshold of the Pch transistor P52 varies in the rapidly falling portion at the node 2, the variation of the delay time of the rising edge at the node 3 is small.

Like the GND current limiting transistor N61, the GND current limiting transistor N64 rapidly discharges negative charge from the drain capacitance to cause a rapid fall of the waveform. Accordingly, it is necessary to set the W of the GND current limiting transistor N64 at about 20 to 30 µm, or about five times or more larger than the W of the Pch transistor P51 and the like.

As for the GND current limiting transistors N63 and N66, which are not configured the same as the GND current limiting transistors N61 and N64, their W may be set small to make the circuit size small. However, it is desirable to set the W of the GND current limiting transistors N63 and N66 equal to that of the GND current limiting transistors N61 and N64 because they are driven by the same Nch transistor current limiting level. While the description above has mentioned that the W of the GND current limiting transistors N61 and N64 is five times or more, it can be twice at least, as long as the necessary drain capacitance is ensured.

As described so far, the current-limited oscillator of this preferred embodiment includes inverters provided with power-supply current limiting transistors in the first block (the first to third stages in the delay stage) and the second block (the fourth to sixth stages in the delay stage), and in at least the first inverters (the first and fourth stages), the transistor size (W) of the power-supply current limiting transistors P61 and P64 (or the GND current limiting transistors N61 and N64) is two times or more larger than the transistor size (W) of the Pch transistor P51 and the Nch transistor N51, so that variations of the delay time can be reduced even when inverters' logical thresholds vary because of process finish variations and temperature variations.

Ninth Preferred Embodiment

A device may adopt a configuration in which a relatively low internal power supply (e.g., about 1.0 V to about 1.2 V) is created from a relatively high external power supply (e.g., about 2 V to about 5 V) through a voltage dropping circuit and the voltage generated by the internal power supply is supplied to internal circuitry. In a ninth preferred embodiment, a charge pump circuit including a constant-current generating circuit, a current-limited oscillator, and a VPP or VBB voltage generating circuit is fabricated using transistors driven by the voltage generated by the internal power supply (about 1.0 V to about 1.2 V) or using transistors having characteristics close to those of such transistors.

Figure 23:
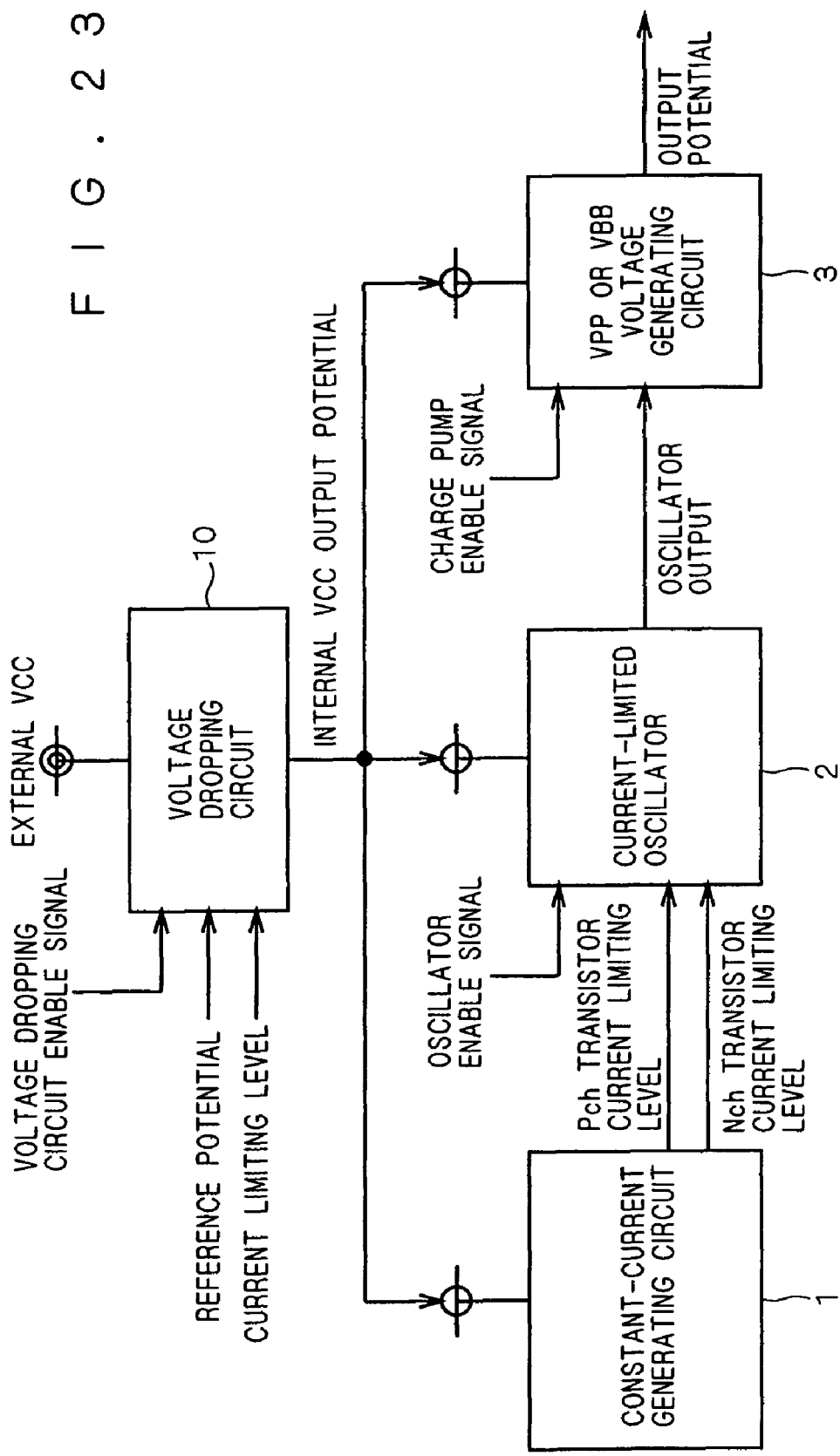
FIG. 23 is a block diagram of a charge pump circuit according to a ninth preferred embodiment of the present invention.

FIG. 23 is a block diagram of the charge pump circuit according to this preferred embodiment. The charge pump circuit shown in FIG. 23 includes a constant-current generating circuit 1, a current-limited oscillator 2, a VPP or VBB voltage generating circuit 3, and a voltage dropping circuit 10. The voltage dropping circuit 10 generates an output voltage (e.g., about 1.0 V to about 1.2 V) of internal power supply (hereinafter referred to also as internal VCC) from an output voltage (e.g., about 2 V to about 5 V) of external power supply (hereinafter referred to also as external VCC) on the basis of a voltage dropping circuit enable signal, a reference potential, and a current limiting level. The output voltage of the internal VCC generated in the voltage dropping circuit 10 is supplied as power-supply voltage to the constant-current generating circuit 1, the current-limited oscillator 2, and the VPP or VBB voltage generating circuit 3.

While the constant-current generating circuit 1 that is supplied with the output voltage of the internal VCC is configured as shown in FIG. 2, the constituent transistors P1, N1 and so on are transistors that are driven by the output voltage of the internal VCC, or transistors having characteristics similar to those of such transistors.

Similarly, the voltage generating circuit 3 is configured as shown in FIG. 3, and the constituent transistors P11, N11 and so on are transistors driven by the output voltage of the internal VCC or transistors having characteristics similar to those of such transistors. The current-limited oscillator 2, too, is configured as shown, e.g., in FIG. 7, and the constituent transistors P41, N41 and so on are transistors driven by the output voltage of the internal VCC or transistors having characteristics similar to those of such transistors.

Figure 24:
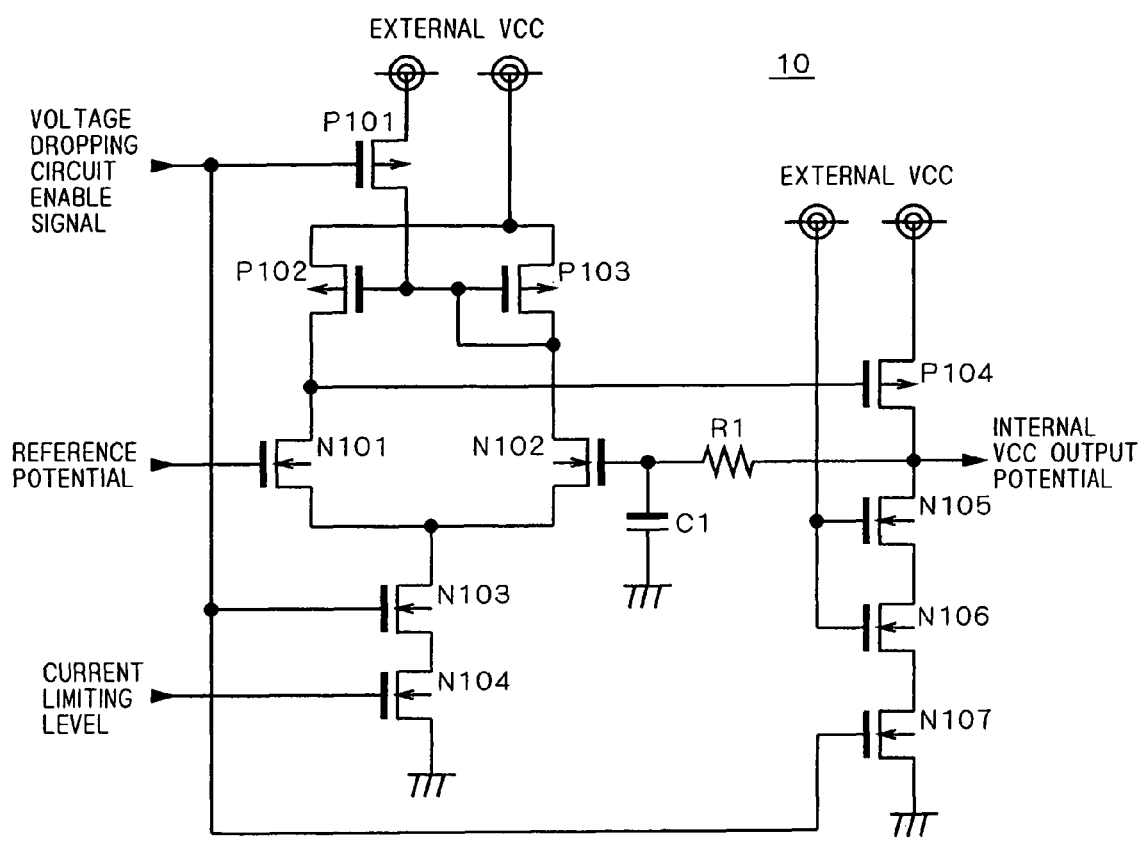
FIG. 24 is a circuit diagram of a voltage dropping circuit according to the ninth preferred embodiment of the present invention.

FIG. 24 is a circuit diagram of the voltage dropping circuit 10. The voltage dropping circuit 10 of FIG. 24 includes a Pch transistor P101 whose gate receives the voltage dropping circuit enable signal and whose source is connected to the external VCC, a Pch transistor P102 having its gate connected to the drain of the Pch transistor P101, a Pch transistor P103 having its gate connected to the gate of the Pch transistor P102, and a Pch transistor P104 having its gate connected to the drain of the Pch transistor P102. The voltage dropping circuit 10 of FIG. 24 further includes an Nch transistor N101 whose gate receives the reference potential, an Nch transistor N102 having its drain connected to the drain of the Nch transistor N101, an Nch transistor N103 whose gate receives the voltage dropping circuit enable signal, an Nch transistor N104 whose gate receives the current limiting level, and Nch transistors N105 to N107 series-connected between the drain of the Pch transistor P104 and GND.

In the voltage dropping circuit 10 of FIG. 24, the output voltage of the internal VCC is supplied from the drain of the Pch transistor P104. The drain of the Pch transistor P104 is connected also to the gate of the Nch transistor N102 through a resistor R1 and a capacitance element C1. In the voltage dropping circuit 1 of FIG. 24, the Pch transistors P101 to P104 and the Nch transistors N101 to N107 are transistors that are driven by the output voltage of the external VCC, and they have thick gate insulating film. In FIG. 24, the gate electrodes are indicated by bold lines in order to show that they are transistors driven by the output voltage of the external VCC. Also, in FIG. 24, the capacitance element C1, too, has such a breakdown voltage that it can be driven by the output voltage of the external VCC, and its one electrode is indicated by a bold line.

As above, with the charge pump circuit of this preferred embodiment, even when the constant-current generating circuit 1 and the like are to be driven with a potential lower than the output voltage of the external VCC, the voltage dropping circuit 10 generates a proper output voltage of the internal VCC for driving, which allows the entire circuit to be fabricated with a single power supply.

Figure 25:
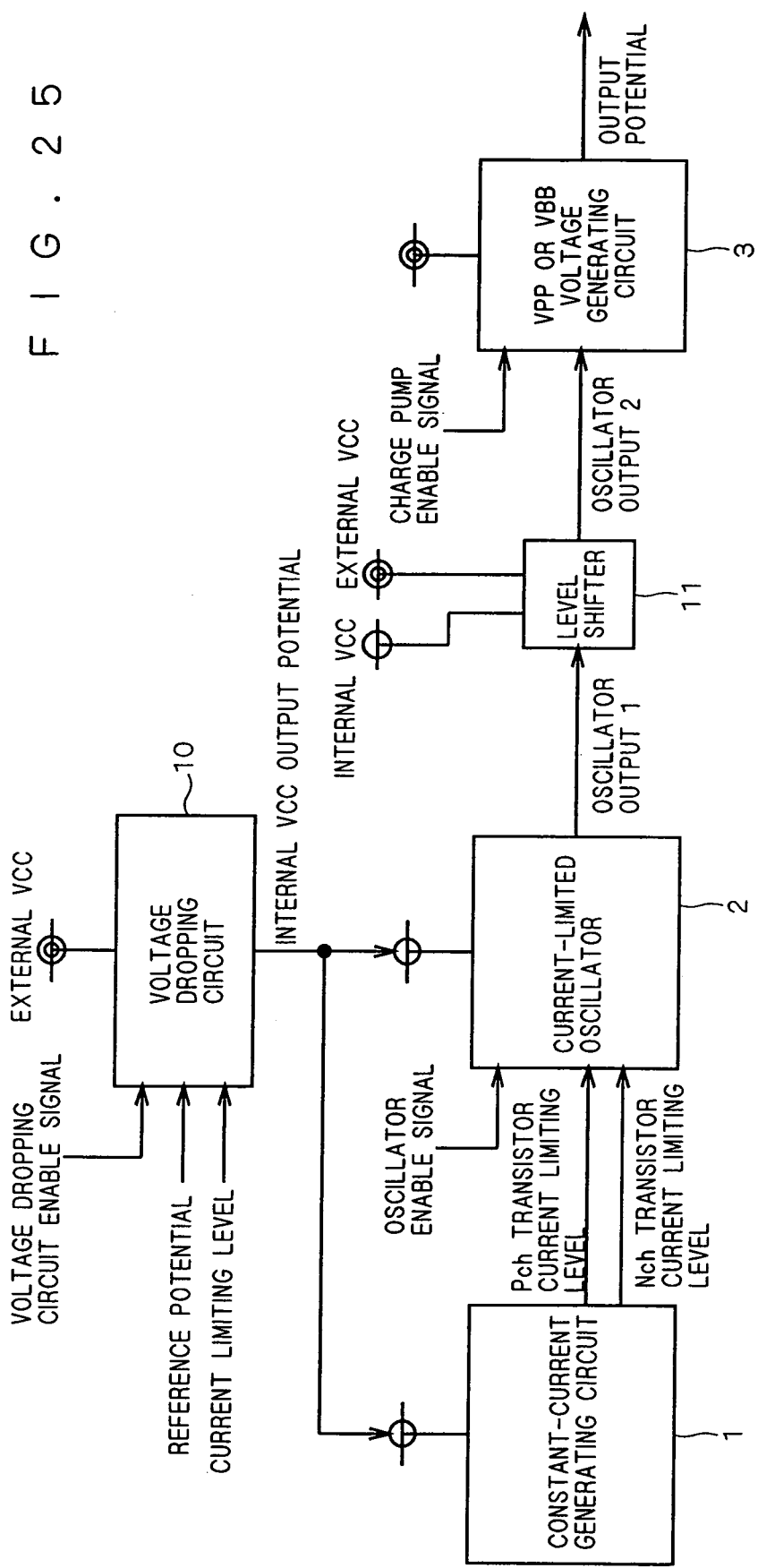
FIG. 25 is a block diagram of a charge pump circuit according to a modification of the ninth preferred embodiment of the present invention.

Next, FIG. 25 shows a modification of the charge pump circuit of this preferred embodiment. In the charge pump circuit of FIG. 25, the output voltage of the internal VCC generated in the voltage dropping circuit 10 is supplied to the constant-current generating circuit 1 and the current-limited oscillator 2, but is not supplied to the VPP or VBB voltage generating circuit 3. The voltage generating circuit 3 of FIG. 25 is supplied with the output voltage of the external VCC that is supplied to the voltage dropping circuit 10.

Accordingly, in the charge pump circuit of FIG. 25, the current-limited oscillator 2 driven by the output voltage of the internal VCC cannot be connected directly to the voltage generating circuit 3 driven by the output voltage of the external VCC. That is, it is necessary to shift the oscillator output 1 of the current-limited oscillator 2 to the level of the oscillator output 2 that would be outputted when it is driven by the output voltage of the external VCC. The charge pump circuit shown in FIG. 25 includes a level shifter 11 to shift the oscillator output 1 to the oscillator output 2.

Figure 26:
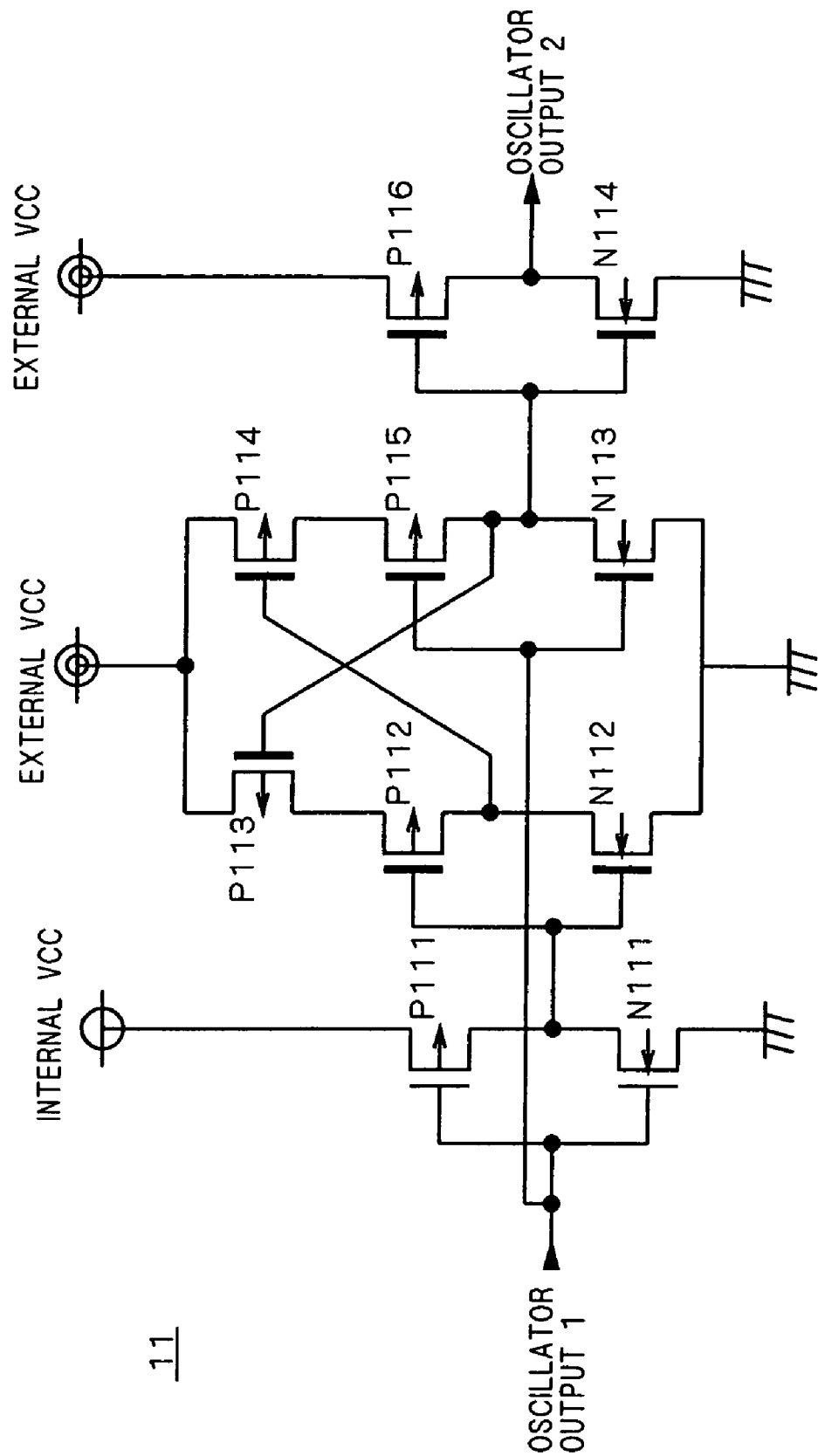
FIG. 26 is a circuit diagram of a level shifter according to the ninth preferred embodiment of the present invention.

FIG. 26 is a circuit diagram of the level shifter 11. The level shifter 11 of FIG. 26 includes a Pch transistor P111 and an Nch transistor N111 whose gates receive the oscillator output 1, where the Pch transistor P111 and the Nch transistor N111 are driven by the output voltage of the internal VCC. The level shifter 11 of FIG. 26 also includes a Pch transistor P112 connected to the drain of the Pch transistor P111 and following Pch transistors P113 to P116, and further includes an Nch transistor N112 connected to the drain of the Nch transistor N111 and following Nch transistors N113 and N114, where these transistors are driven by the output voltage of the external VCC. The oscillator output 2 is outputted from the drain of the Pch transistor P116.

As above, in the charge pump circuit of this modification, the constant-current generating circuit 1 and the current-limited oscillator 2 are driven by the output voltage of the internal VCC, and the voltage generating circuit 3 is driven by the output voltage of the external VCC, and thus the charge pump circuit is driven by two power supplies.

Thus, even when the output voltage of the internal VCC is as low as about 1.0 V to about 1.2 V, the charge pump circuit of this preferred embodiment is capable of performing steady operation with constant frequency regardless of variations of process finishing and temperature condition, and the current-limited oscillator 2 can be configured with a less number of delay stages in a smaller layout area.

Also, according to the charge pump circuit of this preferred embodiment, the output voltage of the internal VCC is supplied to the entire circuitry, or to the constant-current generating circuit 1, the current-limited oscillator 2, and part of the level shifter 11, and the charge pump circuit uses transistors adapted for the output voltage of the internal VCC or transistors having characteristics close to those of such transistors, which allows adaptation of characteristics even with variations of the output voltage of the internal VCC, variations of transistor process, and variations in temperature.

The present invention is applicable to semiconductor storage devices such as DRAMs, and also to semiconductor devices using oscillators or charge pump circuits. Also, when DRAM memory cells are formed of Pch transistors and lead lines connected to the gates of the Pch transistors are of minus potential, the charge pump circuit of the present invention can be applied to the generation of the minus potential. Also, the application used in the present invention can drive by low power-supply voltage around 1.0 to 1.2 V.

While the invention has been described in detail, the foregoing description is in all aspects illustrative and not restrictive. It is understood that numerous other modifications and variations can be devised without departing from the scope of the invention.

What is claimed is:

1. A current-limited oscillator, comprising:
   a delay section that includes a plurality of series-connected inverters to delay an output pulse on the basis of an output of a constant-current generating circuit;
   at least one P-channel transistor that limits a first current between said inverters and a high potential power supply; and
   at least one N-channel transistor that limits a second current between said inverters and a low potential power supply,
   wherein at least one of said plurality of inverters is configured as a first inverter that is connected with said P-channel transistor and is not connected with said N-channel transistor, and at least another of said plurality of inverters is configured as a second inverter that is not connected with said P-channel transistor and is connected with said N-channel transistor, and
   said constant-current generating circuit generates a P-channel transistor current limiting level indication signal supplied to said P-channel transistor and an N-channel transistor current limiting level indication signal supplied to said N-channel transistor.

2. The oscillator according to claim 1, wherein said delay section comprises a portion in which said first inverter and said second inverter are contiguous with each other.

3. A charge pump circuit comprising:
   a constant-current generating circuit;
   an oscillator comprising a delay section that includes a plurality of series-connected inverters to delay an output pulse on the basis of an output of a constant-current generating circuit, at least one P-channel transistor that limits a first current between said inverters and a high potential power supply, and at least one N-channel transistor that limits a second current between said inverters and a low potential power supply, wherein at least one of said plurality of inverters is configured as a first inverter that is connected with said P-channel transistor and is not connected with said N-channel transistor, and at least another of said plurality of inverters is configured as a second inverter that is not connected with said P-channel transistor and is connected with said N-channel transistor; and a voltage generating circuit that generates an output potential based on an output of said oscillator, wherein said constant-current generating circuit generates a P-channel transistor current limiting level indication signal supplied to said P-channel transistor and an N-channel transistor current limiting level indication signal supplied to said N-channel transistor.

4. The charge pump circuit according to claim 3, further comprising a level shifting section that shifts to a given level said current limiting level indication signal outputted from said constant-current generating circuit and supplies said level-shifted current limiting level indication signal to said oscillator.

* * * * *